United States Patent [19]

Crow

[11] Patent Number: 5,642,087
[45] Date of Patent: Jun. 24, 1997

[54] GENERATING HIGHLY UNIFORM ELECTROMAGNETIC FIELD CHARACTERISTICS

[75] Inventor: James T. Crow, Albuquerque, N.M.

[73] Assignee: Sandia Corporation, Albuquerque, N.M.

[21] Appl. No.: 328,849

[22] Filed: Oct. 25, 1994

[51] Int. Cl.$^6$ ........................................... H01F 1/00
[52] U.S. Cl. .......................... 335/216; 335/299; 324/318
[58] Field of Search ........................ 335/216, 299, 335/300, 306; 324/318, 324

[56] References Cited

U.S. PATENT DOCUMENTS

| | | | |
|---|---|---|---|
| 4,833,410 | 5/1989 | Briquet et al. | 324/318 |
| 5,307,039 | 4/1994 | Chari et al. | 335/299 |
| 5,410,287 | 4/1995 | Laskaris et al. | 335/216 |
| 5,530,355 | 6/1996 | Doty | 324/318 |

OTHER PUBLICATIONS

*Magnetic Resonance Imaging* vol. 2 (2d ed. 1988).
Morris, D. "Shielded Four–Conductor Magnetic Field Assembly." *Rev. Sci. Instrum.* 55(9) Sep. (1984): 1483–1485.

"New Products." *Physics Today* Dec. 1993: 47.

Peterson, V. Z. "Nuclear Research Magnets." *High Magnetic Fields* Chapt. 88: 726–736.

"Superconducting Magnets for Particle Accelerators" AIP Conference Proceedings 249, vol. 2, Physics of Particle Accelerator (American Institution of Physics, 1992).

Deutsch, F., "Dipole and Quadrupole Planar Magnetic Fields Produced by Line Currents," *Brit. J. Appl. Phys.* (*J. Phys.D*), 1968, Ser. 2, vol. 1.

*Primary Examiner*—Lincoln Donovan
*Attorney, Agent, or Firm*—Gregory A. Cone

[57] ABSTRACT

An apparatus and method for generating homogenous electromagnetic fields within a volume. The homogeneity provided may be for magnetic and/or electric fields, and for field magnitude, radial gradient, or higher order radial derivative. The invention comprises conductive pathways oriented mirror symmetrically about a desired region of homogeneity. A corresponding apparatus and method is provided for substantially cancelling the electromagnetic field outside of the apparatus, comprising a second set of conductive pathways placed outside the first set.

87 Claims, 26 Drawing Sheets

GENERATING HIGHLY UNIFORM ELECTROMAGNETIC FIELD CHARACTERISTICS

GOVERNMENT RIGHTS

The Government has rights to this invention pursuant to Contract No. DE-AC04-76DP00789 awarded by the U.S. Department of Energy.

BACKGROUND OF THE INVENTION

1. Field of the Invention (Technical Field):

The present invention relates to methods and apparatuses for generating magnetic and/or electric fields with highly uniform field strengths and directions (dipole fields), highly uniform radial gradients of the field strengths within the body of the device (quadrupole fields), or higher order fields (sextupole, octupole, and above) within the body of the device that are highly uniform in the desired radial field derivative. The invention also relates to associated methods and apparatuses for effective cancellation of fields external to the device, and for rotation of fields in space.

The uniform magnetic field and field cancellation devices apply most dramatically to medical magnetic resonance imaging (MRI) and other imaging applications, such as nuclear magnetic resonance microscopy and spectroscopy, and to charged particle beam guiding.

Uniform electric fields have application in charged particle beam guiding, for example in electron beam devices such as oscilloscopes and in mass spectrometers and charged particle energy analyzers.

Uniform dipole fields, uniform radial magnetic field gradients, and higher order multipole magnets have application in charged particle beam guiding and focusing for ion implantation, electron beam devices and in high-power charged particle accelerators.

Uniform and higher order electric field gradients have application in the separation of components of liquids or gases with different dielectric constants, or separation of components with different electric dipole moments whether electric field induced or permanent, such as metal particles in a gas or fluid, or water dispersed in oil.

2. Background Art:

Background Art in the Generation of Uniform (Dipole) Magnetic Fields:

Present devices for generating uniform magnetic fields in relatively large volumes are of three basic types: resistive solenoid magnets; superconductive solenoid magnets; and permanent magnets. Each device has significant drawbacks. Conventional resistive magnets are handicapped by limited field strength (approximately 0.2 T), cooling requirements, power consumption of 50 kW or more, high inductance which makes pulsed operation impractical, generation of substantial fringe fields, and poor patient access in MRI applications.

Conventional superconductive magnets, while providing for high fields (0.5 T to 2 T), have the disadvantages of high cost, need for complex cryogenic systems that are expensive to operate, high inductance (cannot be pulsed), generation of substantial fringe fields, and poor patient access.

Permanent magnets have lower fringe fields and good patient access, but have low magnetic fields (less than 0.1 T), are not adjustable in field strength, cannot be pulsed, and are very heavy (typically more than 12,000 pounds for a 0.064 T system).

An extremely important use of uniform magnetic field generation is MRI diagnostic procedures. They have the critical advantage of being non-invasive, and are not known to cause biological damage. MRI systems employ a strong constant uniform magnetic field (usually 0.3 T to 1.5 T) to align the magnetic dipoles of proton nuclear spins. These aligned dipoles are then tipped out of alignment by a radio frequency pulse. The constant applied field attempts to force the spinning dipoles back into alignment and they precess around the field direction, much like a gyroscope. This coherent precession and spin relaxation produces a radiated signal that is analyzed to produce an image. The actual process is more complicated, using field gradients and a variety of signal processing methods. In all systems, the image quality depends critically on the homogeneity and stability of the applied magnetic field.

The disadvantages of present MRI systems center primarily on the high-field magnet required and its external effects. MRI systems are expensive, with a high-field (1.5 T) system costing about $1,500,000. Much of the total cost of the facility, however, is due to site requirements pertaining to effects of the magnet's field on external objects and the effects of those objects on the magnet. The magnetic fields of conventional MRI systems extend far from the magnet. Referring to FIG. 1, in the conventional solenoidal coil magnet the current-carrying conductors wrap around the axis and the magnetic field lines must close on the outside of the magnet. This is true even if external cancellation coils or shields are used. Ferromagnetic objects near the magnet are strongly attracted toward the bore of the magnet, causing a missile hazard, and also perturb the magnetic field and the concomitant imaging process. The fields can affect pacemakers, instruments, computers, video devices, watches, and even electric motors sufficiently close to the magnet. The Food and Drug Administration (FDA) requires that human access be restricted in areas in which the magnetic field exceeds 0.0005 T (5 G). FIG. 2, taken from Partain et al., *Magnetic Resonance Imaging* vol. 2 (2d ed. 1988), shows the range of the field and recommended minimum distances for various items from a conventional 0.5 T magnet. These requirements are such that the MRI device often cannot be located in a hospital, but must be in a separate remote site. These costs are necessarily reflected in cost to the patient.

The conventional solenoidal magnet configuration also has other disadvantages for the patient. The imaging processes presently in use require the patient to lie as still as possible in the magnet, which is enclosed except for one end, for 30 minutes or more. While every effort is made to reduce the feeling of confinement, 5% to 10% of patients are unable to undergo the procedure because of claustrophobic effects. The procedure is especially difficult for children, particularly because the FDA mandated restricted access inside the 5 G boundary generally excludes everyone but the patient from the room. In addition, access to the patient is difficult, making it hard to ascertain patient status, position, or movement.

The present invention provides devices and methods for generating uniform magnetic fields that reduce or eliminate the disadvantages of present systems listed above. The invention uses a relatively small number of conductors parallel to the long axis, preferably connecting together at the ends. The patient, in the preferred embodiment, enters through the side in a natural opening, rather than through an end, and is not in an enclosed space. The patient may be oriented either along the axis or across the magnet (see FIG. 3). Most importantly, with the use of the field canceling system, the external fields decrease very rapidly with distance from the magnet, permitting elimination of shielding.

FIGS. 4a and 4b show field lines in a 16-wire embodiment of the present invention without (FIG. 4a) and with (FIG. 4b) field canceling coils. The field lines extend well outside the magnet without the field canceling coils, but are confined inside the magnet with field canceling coils. Furthermore, the inductance of the present invention is much lower than that of conventional solenoidal magnets, permitting pulsing of the system.

Background Art in the Generation of Uniform Quadrupole, Sextupole, and Higher Order Magnetic Fields:

Present devices for generating uniform quadrupole (uniform radial gradient), sextupole (uniform first derivative of the radial gradient), and higher order magnetic fields are generally of three types: those that use appropriately shaped iron or a similar ferromagnetic material wound with current-carrying coils; systems of current-carrying conductors without iron cores; and shaped permanent magnet assemblies. These magnetic devices are used primarily for focusing and guiding charged particle beams.

The most common configurations use iron cores and coils as shown in FIG. 5. These devices have the following disadvantages: (1) the useful volume of the device is a small fraction of the total because the beam must be inside the pole faces and most of the volume is occupied by the coils and iron cores; (2) the iron cores are a complex shape and must be machined with high accuracy; (3) the accuracy of the system is limited by the accuracy of the machining of the pole faces and by small variations in the homogeneity of the permeability of the iron core; and (4) the maximum magnetic field strength available in this device is limited by onset of saturation of the iron core, which introduces nonuniformities in the fields and field gradients.

Systems using permanent magnets in lieu of current-carrying coils have most of the same limitations listed above, in that they usually use shaped iron pole faces or shaped permanent magnets. In addition, such systems are limited in field strength by the permanent magnets and are not readily adjustable in field strength.

Systems using coils without iron cores avoid many of the above difficulties, but generally depend on approximations to a $\sin(\phi)$ or $\cos(\phi)$ current distribution of limited accuracy, depend on shims and wedges to improve accuracies of the fields, and have a useful beam area that is small relative to the magnet size. FIG. 6 shows a schematic of a dipole magnet in use in several accelerators. Schmuser, "Superconducting Magnets for Particle Accelerators," AIP Conference Proceedings 249, vol. 2, Physics of Particle Accelerators (American Institute of Physics, 1992).

The present invention, in the configuration that produces uniform field gradients or higher order multipoles, eliminates the need for iron cores to achieve high accuracy, is simple in construction in that it requires a relatively small number of conductors to achieve high accuracy in a volume that is a high percentage of the total device volume, and is not limited in field strength by saturation of iron cores. The system is well-behaved, and can readily achieve field gradient accuracies much greater than devices using iron cores. The present invention also has the advantages of open construction and easy access. This is advantageous when employing, e.g., beam test instrumentation or other beam guiding elements, such as electrical guiding plates.

The present invention, in the quadrupole and higher order configurations, can also use a system of field cancellation coils similar to those of the uniform field configuration to reduce stray external fields to a very low value. Field cancellation in the radial gradient (quadrupole) and higher order multipole configurations is even more effective than in the dipole field configuration, since the main generating coils are quadrupole and higher order, rather than dipole, and so the external fields generated by the combination of the main and field canceling coils behave as even higher order multipoles, and decrease more rapidly with distance.

Background Art in the Generation of Uniform Electric Fields:

Electric fields that are uniform in magnitude and direction are commonly generated by establishing an electric potential difference between two parallel conducting plates. Until the conception of the present invention there has been no method for locating individual charged line conductors in a configuration that produces a volume of uniform electric field that is large compared to the volume of the apparatus. In the present invention, in the configuration of linear conductors or loops that produce uniform magnetic fields when energized with a current, if the conductors each have electric charges of identical magnitudes applied (opposite polarity in the conductors that had opposite currents in the magnetic field configuration of the invention), the result is an electric field that has the same uniformity characteristics as the magnetic field configuration of the invention, but rotated ninety degrees.

Uniform electric fields have applications in guiding and turning charged particle beams, for example electron beams in oscilloscopes and similar fluorescent-screen imaging devices, in high energy particle accelerators, and in charged-particle-beam energy analyzers.

This linear-conductor large-volume electric dipole has the advantages of being light in weight and open for access to the useful center area. It also has very low capacitance, since the conductor surface area is very low compared to the parallel-plate devices, and so the generated electric field can be ramped at very high rates, which is useful for swept beams in imaging devices and time-resolved energy analyzers. In beam turning applications, a small difference in the charges applied to the conductors in each of the two halves of the device results in a small linear electric field gradient in the beam region, which is useful for beam centering in the turning system.

Leakage fields external to the device can be greatly decreased without solid shielding in the same way as with the magnetic field device. A system of conductors with the same azimuthal locations as the main field generating conductors, but at larger radius and carrying charges that are opposite in polarity and reduced in magnitude from the main conductor charges by the ratio of the main conductor cylinder radius to the field cancellation conductor cylinder radius reduces the external fields in the same manner as in the magnetic field version of the device.

Background Art in the Generation of Rotating Fields:

Highly uniform rotating magnetic fields have particular application in nuclear magnetic resonance spectroscopy, where at present solid samples are sometimes rotated at high speeds with rotation axes at or near a particular angle (about 54 degrees, the so-called "magic angle") with the magnetic field, which significantly enhances signal-to-noise ratios. The present invention allows high-speed rotation of the magnetic field, keeping the sample stationary. This permits rotation angular velocities far in excess of that achievable by mechanical systems, allowing extension to new regimes of rotation velocities, and to samples that would be destroyed when mechanically rotated in existing devices. The system of conductors that produces the rotating transverse magnetic field can be combined with an appropriately designed solenoid that produces a uniform constant longitudinal field so that the rotating net field vector makes any desired angle with the longitudinal axis of the system. Rotating fields can also be applied to imaging techniques, limited in the case of medical imaging to maximum rates of change of magnetic field set by the U.S. Food and Drug Administration (FDA).

SUMMARY OF THE INVENTION
(DISCLOSURE OF THE INVENTION)

The present invention is of an apparatus and method for generating an electromagnetic field having a region of homogeneity of a characteristic of the electromagnetic field, comprising: establishing a central axis; providing at least six conductive pathways, disposed about and substantially parallel to the central axis, at azimuthal locations substantially defined by locations selected from the group consisting of an x-axis, solutions to $$\cos(3\phi_n) + \cos(3\phi_{n-1}) + \ldots + \cos(3\phi_1) + w = 0,$$

the solutions divided by a positive integer, and the solutions divided by a positive integer reflected about a plane of reflection, where n is a number of conductive pathways per quadrant and w is selected from the group consisting of 0 and 0.5; and generating the electromagnetic field comprising a region of homogeneity of rate of rotation, field magnitude, radial gradient, or a higher order radial derivative of field magnitude. In the preferred embodiment, the azimuthal locations may include solutions to one or more of The invention may be employed as any of a variety of devices, including as magnetic resonance imager, pulsed magnetic resonance imager, magnetic resonance microscope, nuclear magnetic resonance spectroscope, charged particle beam steerer, charged particle momentum analyzer, high-field pulsed-beam charged particle momentum analyzer, time-resolved charged-particle momentum analyzer, atomic clock, isotope separator, charged particle beam focuser, separator for removing ferromagnetic material from fluids, charged particle beam guider, charged particle energy analyzer, separator of fluids having different dielectric properties, and separator of particles from fluids.

The invention is also of an apparatus and method for generating an electromagnetic field internal to a device and a substantially reduced electromagnetic field external to the device, comprising: providing a first plurality of conductive pathways; generating a cylindrical core volume of electromagnetic field within a volume defined by the first plurality of conductive pathways; and providing a second plurality of conductive pathways for substantially cancelling the electromagnetic field external to the second plurality. The conductive pathways may be current sheets. In the preferred embodiment, the second plurality of conductive pathways are at an identical azimuthal position from the center of the core volume as the corresponding pathway of the first plurality of conductive pathways. A current is passed through each of the second plurality of conductive pathways approximately equal to a current passing through each of the $$\cos[(2n+1)\phi_n] + \cos[(2n+1)\phi_{n-1}] + \ldots + \cos[(2n+1)\phi_1] + w = 0$$
$$\cos[(2n-1)\phi_n] + \cos[(2n-1)\phi_{n-1}] + \ldots + \cos[(2n-1)\phi_1] + w = 0$$
$$\cos[(2n-3)\phi_n] + \cos[(2n-3)\phi_{n-1}] + \ldots + \cos[(2n-3)\phi_1] + w = 0$$
.
.
.
$$\cos(5\phi_n) + \cos(5\phi_{n-1}) + \ldots + \cos(5\phi_1) + w = 0 \text{ and}$$
$$\cos(3\phi_n) + \cos(3\phi_{n-1}) + \ldots + \cos(3\phi_1) + w = 0,$$

as well as the solutions divided by a positive integer, and the solutions divided by a positive integer reflected about a plane of reflection. The conductive pathways may define an approximately biconic volume having a long axis parallel to the central axis. If the field generated is a magnetic field, the conductive pathways preferably carry a substantially identical line current magnitude. However, if a transverse gradient is desired (such as with a curved central axis), not all conductive pathways will carry substantially the same line current magnitude. If the field generated is an electric field, the conductive pathways preferably carry a substantially identical line charge. Not all will do so if a transverse gradient is desired. If desired, the electromagnetic field external to the apparatus may be canceled via a plurality of conductive lines equal in number to the conductive pathways, at the same azimuthal positions as the conductive pathways. Current may be pulsed through the conductive pathways, where desirable, such as by homopolar generators, rotating flywheel energy storage systems, capacitive electrical storage and discharge systems, and high-current power supplies operating directly from electrical mains. Each conductive pathway may be a cluster of wires having a central wire, which by adjusting current in the wires permits tuning of the field centroid of the cluster of wires. The conductive pathways may be current sheets. An electromagnetic shield around the device may be employed, where useful. The ends of the conductive pathways of opposite charge may be joined using loops of conductive material, current sheets, or conductive plates.

first plurality of conductive pathways multiplied by the ratio of the distance of the second plurality of conductive pathways from the center to the distance of the first plurality of conductive pathways from the center. This may be effected by forming each of the second plurality of conductive pathways of n conductive lines and each of the first plurality of conductive pathways of m conductive lines, n/m being approximately equal to the ratio just discussed.

The present invention is also of a method for producing an apparatus for generating a region of a substantially uniform electromagnetic field characteristic, said apparatus comprising a central axis, comprising: determining initial sites for a plurality of conductive pathways about and substantially parallel to the central axis; simulating the siting of the plurality of conductive pathways; plotting $B_x=0$ contours resulting from the simulation; altering the sites of one or more of the plurality of conductive pathways; and repeating the simulating, plotting, and altering steps until desired $B_x=0$ contours are achieved. In the preferred embodiment, the repetition continues until a predetermined plurality of $B_x=0$ contour crossings of an origin are achieved.

The present invention is further of an apparatus for magnetic resonance imaging, comprising a plurality of conductive pathways generating a core volume of magnetic field substantially homogenous in both magnitude and direction, the apparatus being substantially open to an ambient environment of a patient. Preferably, the apparatus comprises a side opening along the long axis of the apparatus through which the patient may pass into and out of the apparatus, and includes a plurality of conductive lines external to the plurality of conductive pathways used for substantially cancelling the magnetic field external to the apparatus, with the conductive lines located at the same azimuthal positions as the plurality of conductive pathways.

The present invention is additionally of an apparatus for generating an electromagnetic field having a substantially uniform radial gradient, comprising a plurality of conductive pathways generating a cylindrical core volume of electromagnetic field substantially uniform in radial gradient. In the preferred embodiment, the conductive pathways are each placed on a circle about a long axis of the cylindrical core volume and are substantially parallel to the long axis, define an approximately biconic volume having a long axis parallel to the long axis of the cylindrical core volume, and are placed on the circle mirror symmetrically about both x and y axes of the circle. If the field is magnetic, each of the conductive pathways comprises a substantially identical line current magnitude, and if electric, a substantially identical line charge. The apparatus may include a plurality of conductive lines external to the plurality of conductive pathways used for substantially cancelling the electromagnetic field external to the apparatus, with the conductive lines located at the same azimuthal positions as the plurality of conductive pathways.

The present invention is also of an apparatus for generating an electromagnetic field having a directional rotation in time, comprising a plurality of conductive pathways generating a cylindrical core volume of electromagnetic field substantially uniform in magnitude or radial gradient and causing the electromagnetic field to rotate. The field may be caused to rotate substantially continuously or by steps. In the preferred embodiment, the conductive pathways are each placed on a circle about the long axis of the cylindrical core volume and the conductive pathways are substantially parallel to the long axis, and the conductive pathways comprise a first and a second set of rotated 90 degrees with respect to each other. The current in the first set varies as $\sin(a)$ and the current in the second set varies as $\cos(a)$, where a is a variable. If field magnitude variation is desired as well as rotation, the peak current in the first set differs from the peak current in the second set. A solenoid may be placed around the conductive pathways to provide to the electromagnetic field a field vector having a constant component in the longitudinal direction. The apparatus may include a plurality of conductive lines external to the plurality of conductive pathways used for substantially cancelling the electromagnetic field external to the apparatus, with the conductive lines located at the same azimuthal positions as the plurality of conductive pathways. The invention may be employed as a quadrupole magnet rotating rapidly compared to a transit time of a stream of particles, whereby the stream of particles is focused.

The present invention is further of an apparatus for generating a homogenous electromagnetic field, the apparatus comprising a plurality of conductive pathways generating a cylindrical core volume of both magnetic and electric field substantially homogenous in both magnitude and direction. In the preferred embodiment, the conductive pathways are each placed on a circle about a long axis of the cylindrical core volume, the conductive pathways being substantially parallel to the long axis, and the line charges of each of the conductive pathways are substantially identical.

The present invention is additionally of an apparatus for generating an electromagnetic field having a substantially uniform nth derivative of field magnitude, the apparatus comprising a plurality of conductive pathways generating a core volume of the electromagnetic field, where n is an integer greater than 1. In the preferred embodiment, the conductive pathways are each placed on a circle about a long axis of the cylindrical core volume, the conductive pathways being substantially parallel to the long axis.

The present invention is also of an apparatus for separating substances in mixture or solution comprising means for generating an electric field having a substantially uniform nth derivative of field magnitude, the apparatus comprising a plurality of conductive pathways generating a core volume of the electric field, where n is an integer greater than 1. In the preferred embodiment, the conductive pathways are each placed on a circle about a long axis of the cylindrical core volume, the conductive pathways being substantially parallel to the long axis.

A primary object of the present invention is to provide methods and apparatuses for generating large-volume, highly uniform, magnetic and/or electric fields (dipole fields), or magnetic and/or electric fields with highly uniform gradients (quadrupole fields), or magnetic and/or electric fields with highly uniform higher order fields (sextupole, octupole, etc., fields) or magnetic and/or electric fields whose vector directions rotate in time about the longitudinal symmetry axis of the system at any chosen angle with respect to that axis.

An additional object of the magnetic field versions of the present invention is to eliminate many of the disadvantages of existing solenoid and permanent magnet and iron core systems for producing uniform magnetic fields or field gradients or higher order fields.

Another object of the present invention is to provide systems requiring little or no external shielding to greatly reduce leakage fields from the device.

Another object of the present invention is to allow the use, if needed, of external shields that protect the interior of the device from external fields without adversely affecting the homogeneity of the internal fields.

Yet another object of the present invention is to provide for large-volume, uniform magnetic fields useful for a variety of applications: MRI, pulsed MRI, NMR, chemical shift spectrometry, atomic clocks, fluid flow imagers, mass spectrometers, charged particle analyzers, guiding fields for turning charged particle beams, and the like.

Yet another object of the present invention is to provide for large volume magnetic fields with uniform gradient or higher order fields for use in focusing charged particle beams in accelerators, ion implantation, electron beams used for surface heating or welding and image producing devices, and the like.

Still another object of the present invention is to provide for highly uniform electric fields over large volumes using a highly open, low capacitance device that can be easily and rapidly pulsed or driven with high frequency varying potentials for beam steering in imaging devices and in beam energy analyzers and the like.

Yet another object of the present invention in its rotating magnetic field embodiment is to eliminate the limitations and disadvantages inherent in the rotating-sample methods of nuclear magnetic resonance microscopy and spectroscopy, by allowing much higher rotation rates of the sample with respect to the magnetic field since the low inductance rotating-field generator can be driven at high frequency and the sample remains stationary, and since the sample is stationary, allowing measurements of delicate samples that would be deformed or destroyed by the high accelerations of rotation.

The primary advantages of the uniform magnetic field embodiment of the present invention are that a large fraction of the magnet volume contains useful field and that it generates low external fields, incurs little perturbation from external objects, requires little or no additional shielding, and is low weight.

An additional advantage of the uniform magnetic field embodiment of the present invention is that it is readily located in multi-use buildings, such as hospitals, and may even be placed near other sensitive systems.

Another advantage of the present invention is that it produces no "missile effect" and operators incur negligible exposure to fields.

Yet another advantage of the imaging applications of the present invention is that it is patient friendly: the open geometry reduces claustrophobia, allows ready evaluation of patient condition, and the low external fields allow other persons (e.g., family) to remain nearby, even with large fields in the magnet interior.

Still another advantage of the present invention is that it provides improved instrument access, such as for imaging equipment and for patient positioning measurements in magnetic resonance imaging applications, and easy instrument and diagnostic access in other applications.

A further advantage of the present invention is that it can readily be scaled for specific applications; e.g., patients can lie across a compact version used exclusively for limbs, or a long, relatively small diameter magnet with its long side access slot may be employed for imaging sheets of material for defects.

Another advantage of the present invention is that it may be readily tuned during construction or on site by repositioning the small number of conductors or by using small currents in conductors near and parallel to the primary conductors.

An additional advantage of the present invention is that it can provide natural B-gradients for imaging applications requiring them.

Yet another advantage of the present invention is that it provides for low inductance in magnetic field embodiments, which permits pulsing of the invention, rendering feasible image data processing and interpretations at central locations of magnetic resonance images such as is now done with electrocardiograms (EKGs), and reducing cooling requirements for the magnet because of low duty cycle.

Still a further advantage of the present invention is that it may be incorporated into a system that is mobile, because the invention is low weight, generates small external fields, and is not subject to perturbations caused by external objects.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating the preferred embodiments of the invention and are not to be construed as limiting the invention. In the drawings.

DESCRIPTION OF THE PREFERRED EMBODIMENTS (BEST MODES FOR CARRYING OUT THE INVENTION)

The present invention produces large-volume, highly uniform, magnetic and/or electric fields, preferably in a cylindrical system. The invention produces fields with high uniformity over a large fraction of the interior of a cylinder, using a relatively small set of conductors parallel to the cylinder axis. The fields external to the set of conductors can be effectively canceled by a set of conductors of larger radius in the same azimuthal positions as the primary set. The invention is extensible to other volumetric systems, such as ovoid and biconic, by applying appropriate mathematical translations from the right-circular-cylindrical to the other volumetric geometry.

The invention is also extensible to systems of higher order magnetic multipoles (uniform radial gradient quadrupole, uniform first-derivative sextupole, etc.) from the uniform field (dipole) configurations by applying appropriate spatial transformations as described below. The descriptions that follow will be of the uniform field embodiment of the invention. Descriptions of uniformity, linearity, and other characteristics of the fields apply equally to the higher-order multipole configurations by substituting "uniform radial gradient" in the quadrupole versions for "uniform field" in the dipole descriptions, and similarly substituting "uniform first derivative of the radial gradient" in the sextupole versions, etc. Elaboration of specific higher order characteristics will be made where needed.

There is an exact analogy between production using the invention of magnetic fields by sets of line currents and production of electric fields by line charges. If uniform equal line charges are substituted for line currents in the following descriptions, electric fields are produced that have the same uniformity or gradient characteristics as the corresponding magnetic fields, but rotated 90 degrees about the cylinder axis.

Figure 4A:
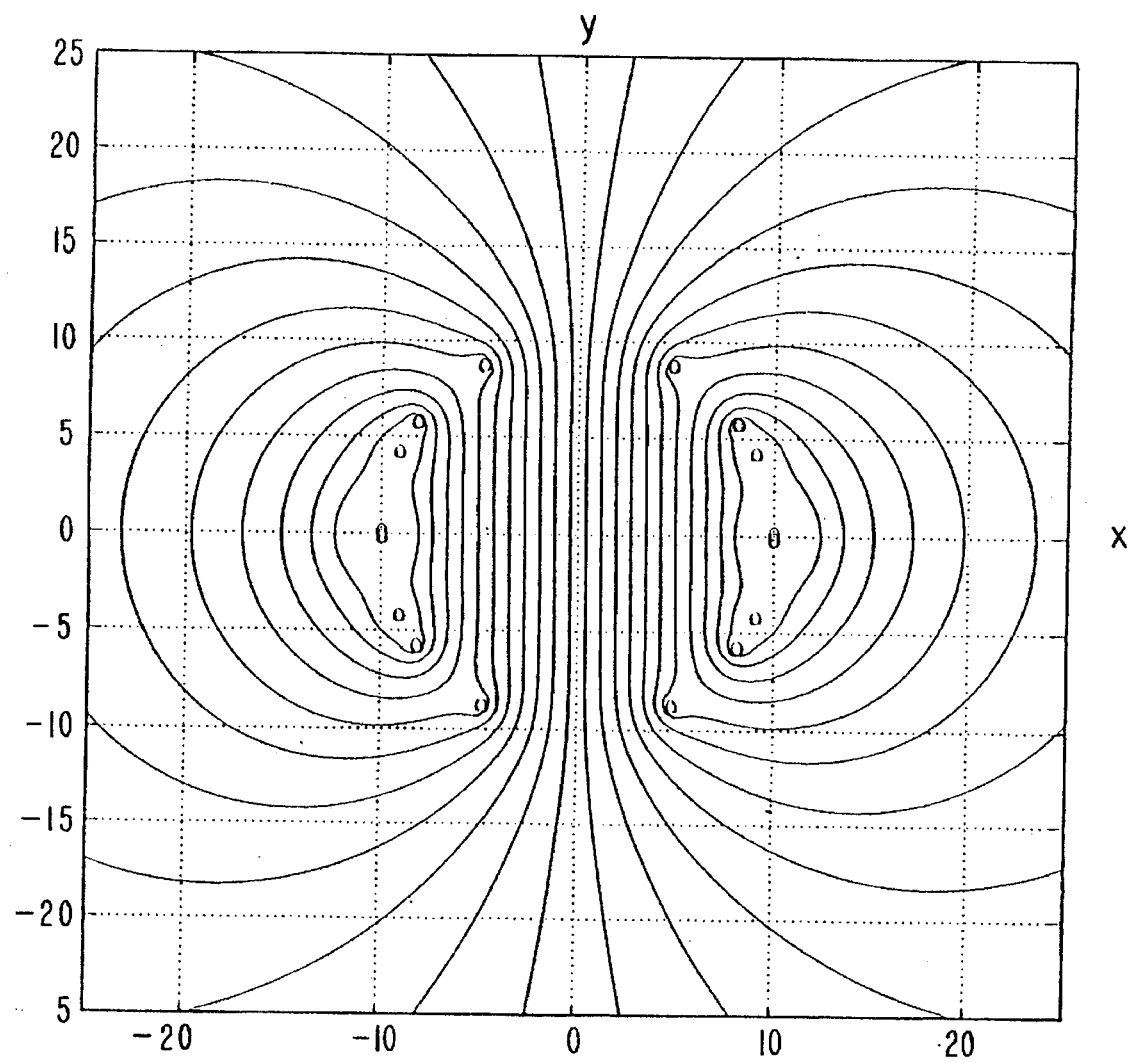
FIG. 4a shows field lines for a 16-wire configuration of the present invention without field cancelation.

The invention produces a desired magnetic field $B_y$ (z being the coordinate of the long axis of the cylinder) by a current in sets of conductive pathways (such as wires or groups of wires) whose centroids are located on a cylindrical surface (not necessarily a right circular cylinder) and located at specific angles measured from a symmetry plane. Currents in all conductive pathways are preferably identical in magnitude, with currents in the right half-plane opposite those in the left half-plane in the uniform field (dipole) configuration, opposite in adjacent quadrants in the quadrupole case, and so on for higher order multipoles. A 16-wire embodiment of the uniform field case of the invention is shown in cross-section in FIGS. 4a and 4b, with lines of B plotted. (At times in this application, "wire" will be used as a short-hand notation for conductive pathway, while the broader concept is always intended.)

Figure 7:
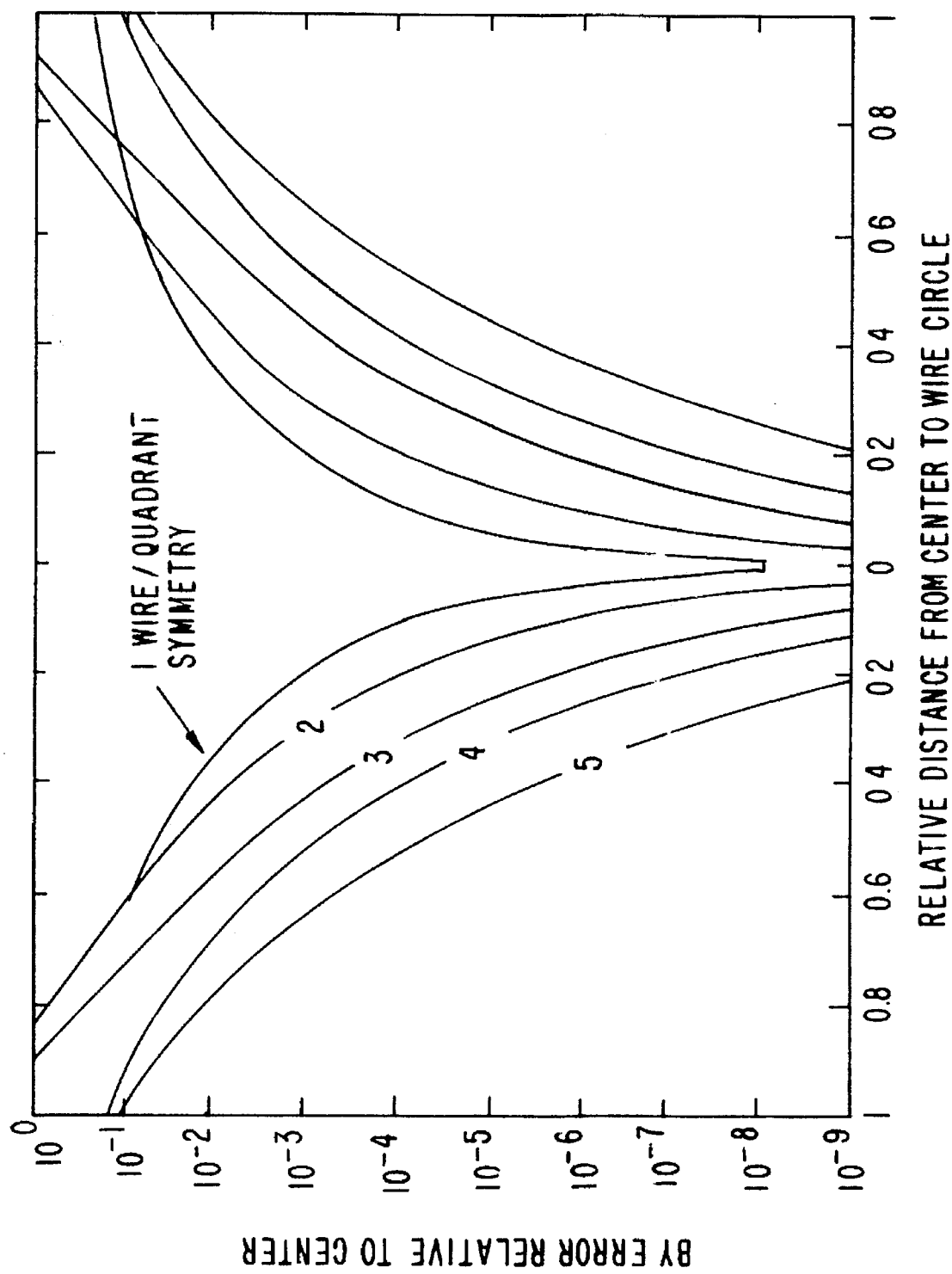
FIG. 7 is a graph of the error in $B_y$ in powers of 10 referenced against $B_y$ at the center versus distance from the center along one axis for 4, 8, 12, 16, and 20-wire embodiments of the present invention, labeled as 1, 2, 3, 4, and 5-wire symmetry cases reflecting the number of $B_x=0$ contour crossings per quadrant.

The area of field of a given high uniformity (defined as $B_y(x,y)/B_y(0,0)-1$ with x and y in the plane of a cross-section of the cylinder) is a large fraction of the cross-sectional area of the cylindrical surface on which the wires are located if the wires are positioned correctly according to the method of the invention. The size of the area of given uniformity increases with the number of wires used in optimum configurations, as illustrated in FIG. 7. Additionally, the field is well-behaved, with a nearly circular area of given uniformity, and with uniformity increasing monotonically with decreasing radius from the cylinder axis at all angles. The system scales linearly: the ratio of the radius of a given field uniformity to the wire cylinder radius is constant, the magnitude of the field increases linearly with wire current, and the magnitude of the field for a given current decreases as the inverse of the wire cylinder radius. The uniformity of $B_y$ in the present invention is independent of the presence of conducting or high-permeability coaxial shields external to and coaxial with the wire cylinder.

The uniform field embodiment of the invention also allows near-linear gradients in $B_y$ along x (particularly useful for magnetic resonance systems) to be produced by a simple uniform decrease in the currents or increase in the radius of the cylindrical surface on which the wires are located for the wires at negative x coordinates. This bias can also be used to compensate for the gradient produced by curving the system (to follow a charged beam being turned by the magnetic field) to return the field to uniform, or to produce a focus or increased particle energy acceptance range.

An iterative method for identifying optimum conductive pathway configurations involves plotting contours of constant fractional error in $B_y$ and contours of $B_x$. Such plots are preferably done by computer, for example with MATLAB (The Mathworks, Natick Mass.) software on the Apple Macintosh or IBM-PC-compatible platforms. The best field behavior (smoothness near the center) is achieved when the conductive pathways in the set are located such that contours of $B_x=0$ cross at the origin (center of the cylinder). The optimum (largest area of given uniformity) is achieved when the number of origin crossings of $B_x=0$ per quadrant is the largest achievable with the given number conductive pathways; this maximum number of crossings of the origin of $B_x=0$ contours is generally equal to the number of wires per quadrant (excluding the x and y axes, which by symmetry are $B_x=0$ contours). This can be verified by comparing plots of contours of fractional error of $B_y$ for various cases and noting that the largest area of a given uniformity occurs when the $B_x=0$ crossing criterion is satisfied. There is a small number of these optimum configurations for a given number of wires.

When the $B_x=0$ contours cross (or nearly cross) the origin, the contours of fractional error of $B_y$ form closed curves surrounding the origin that are scalloped and very nearly circular. If the $B_x=0$ contours do not cross the origin (which may happen if there are wire placement inaccuracies) the $B_x=0$ contours will close in loops. The approximate radius at which the $B_x=0$ loops close corresponds to the radius of best $B_y$ homogeneity. The $B_x=0$ contours and $B_y$ fractional error contours are, therefore, an effective tool for design of the uniform field magnets. This is further illustrated in the descriptions below.

It is convenient to distinguish two wire-set types: those in which there are no wires on the x-axis, thus producing an even number of wires in the semicircle with positive x (or negative x) coordinates; and the configuration in which there are conductive pathways on the x-axis, producing an odd number of wires in the positive-x semicircle.

Preferably, the wire sets are mirror-symmetric about both x and y planes, with the current reversed in the wires with negative x coordinates. Since the field uniformity is independent of the radius of the wire circle, the preferred wire locations are completely defined by angles measured from the x-axis. Only the first quadrant need be specified, with the remaining wires located by symmetry.

Figure 8:
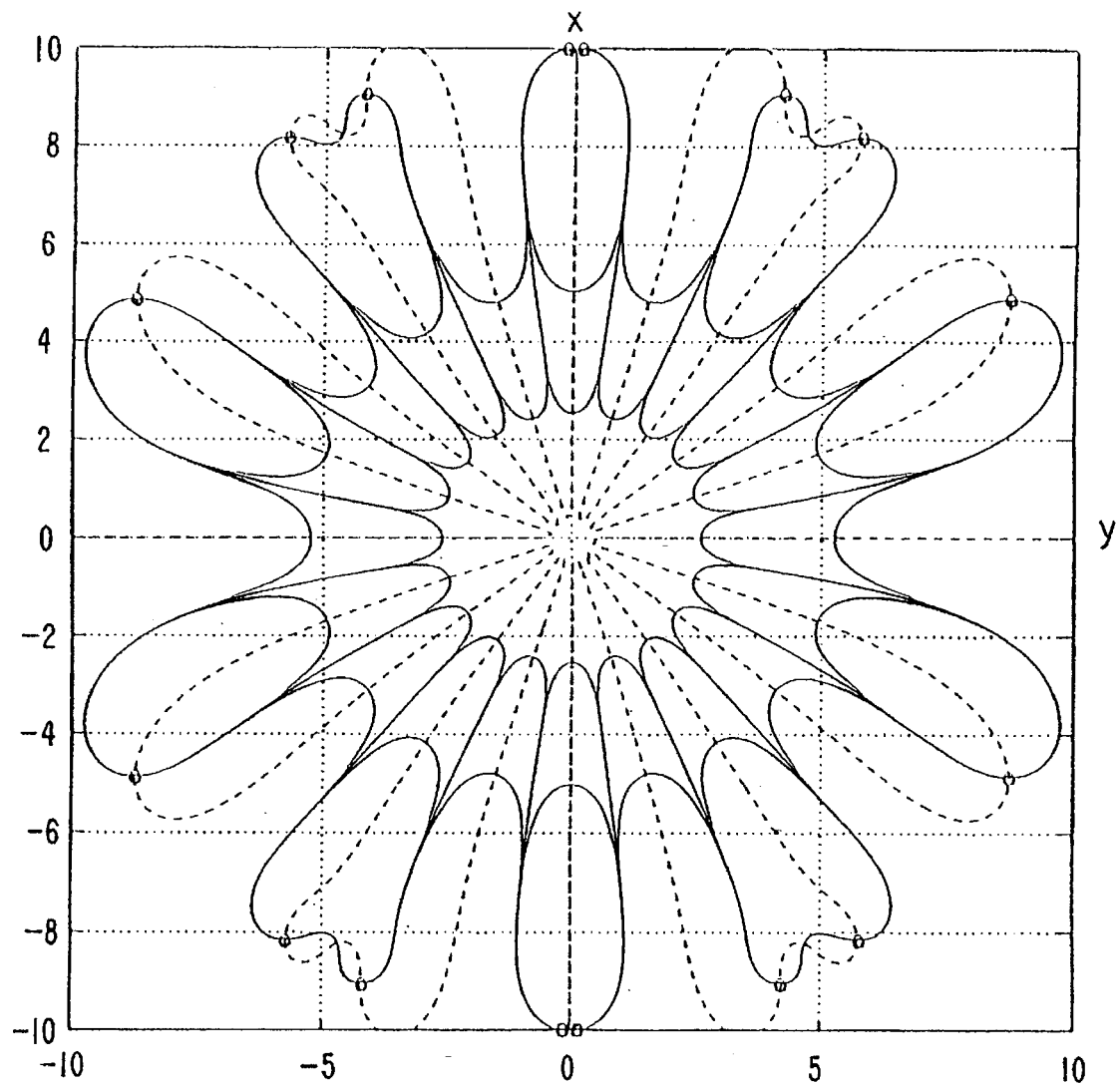
FIG. 8 shows contours of constant error in $B_y$ referred to the value on axis (solid curves), combined with a plot of contours of $B_x=0$ (dashed curves) for an optimum 16-wire configuration of the present invention (inner scalloped circle is that of $B_y$ error of 1 part per million (PPM), and larger scalloped circle is for a $B_y$ error of 1000 PPM)
Figure 9:
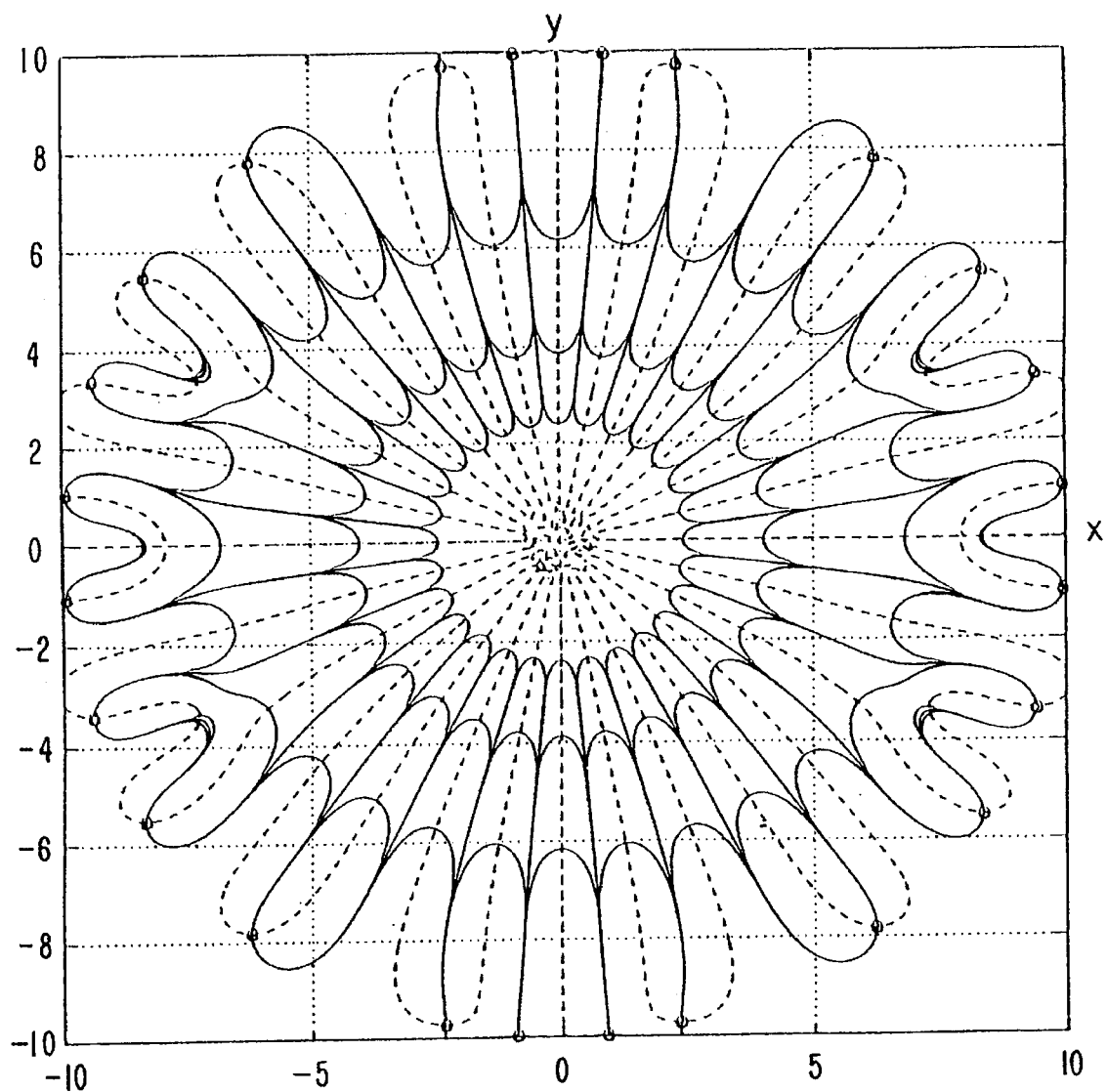
FIG. 9 shows contours of constant $B_y$ error for an optimum 24-wire configuration of the present invention (inner scalloped circle is for a $B_y$ error of 0.001 PPM, intermediate scalloped circle is of 1 PPM, and outer is of 1000 PPM; dashed curves are $B_x=0$ contours)

FIG. 8 shows contours of $B_x=0$ (dashed) and $B_y$ fractional error (solid lines) of 1 (inner scalloped circle) and 1000 (outer scalloped circle) parts per million (PPM) for an optimum 16-wire case. The apparent failure of the $B_x=0$ lines to cross the origin is an artifact of the plotting. FIG. 9 shows contours of constant $B_y$ error of 0.001 (inner scalloped circle), 1 (intermediate scalloped circle), and 1000 (outer scalloped circle) PPM for a 24-wire configuration which shows a rapid improvement with increased numbers of wires. Note that the radius of 0.001 PPM error in the 24-wire case is almost as large as the radius of 1 PPM error for the 16-wire configuration.

Figure 10:
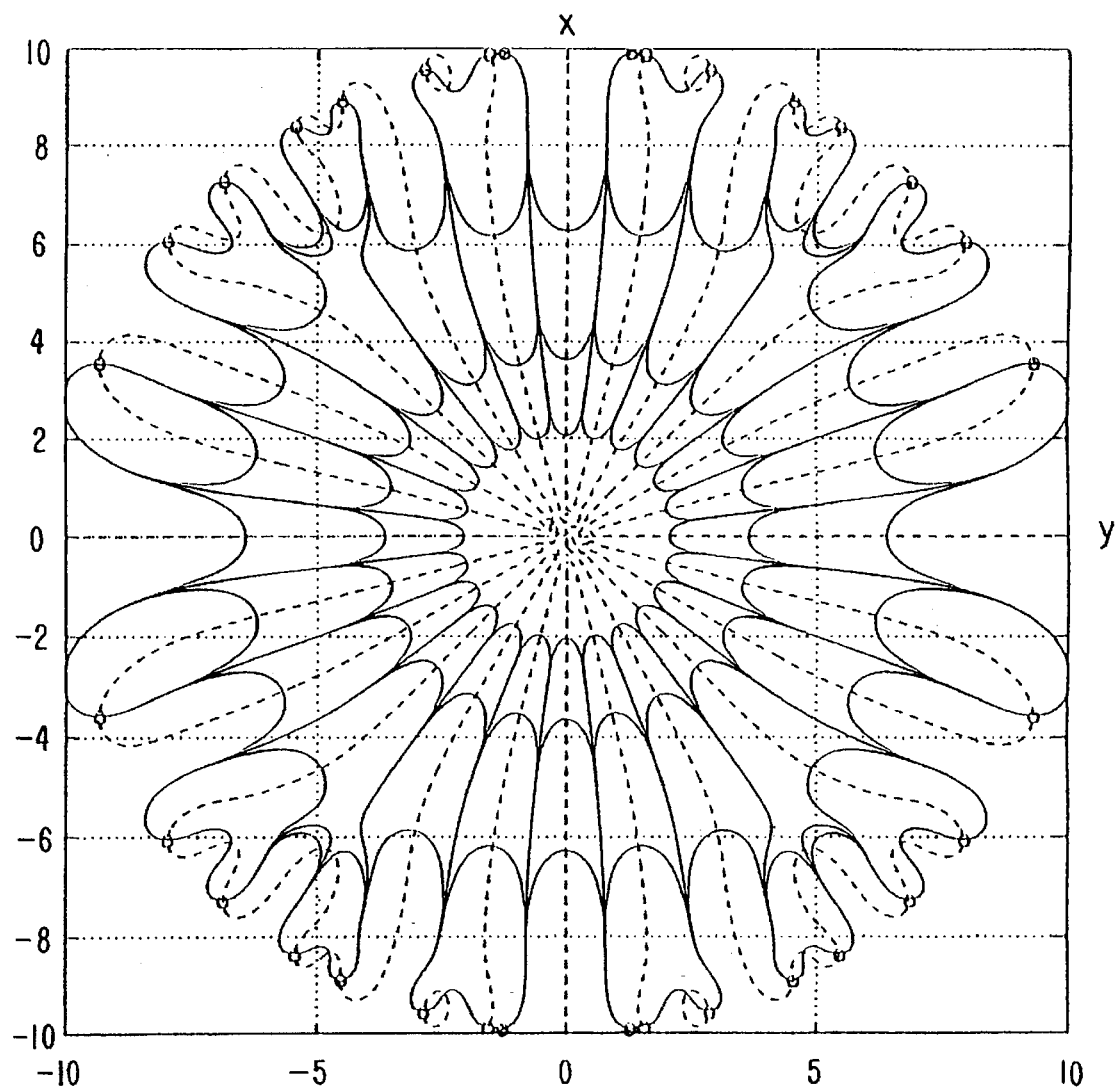
FIG. 10 shows contours of constant $B_y$ error and $B_x=0$ contours for a sub-optimum 32-wire configuration with 5-wire symmetry (note five $B_x=0$ contour origin crossings per quadrant (excluding x and y axes))

With a given number of wires, there are configurations that produce a smaller number of $B_x=0$ origin crossings than the number of wires in the set, as illustrated by the 32-wire, 5-crossing case shown in FIG. 10 with contours of $B_y$ error of 0.001, 1, and 1000 PPM. These prove to be well-behaved in $B_y$, and have areas of given uniformity similar to those produced by the optimum configurations of the smaller number of wires (5) that corresponds to the number of $B_x=0$ crossings. Note that the outer (1000 PPM) contour is not nearly so circular as the inner circles, nor as circular as the 1000 PPM contour for the 24-wire case. This is usual when the wire locations produce a field that is less than optimum for the number of wires used.

Figure 11:
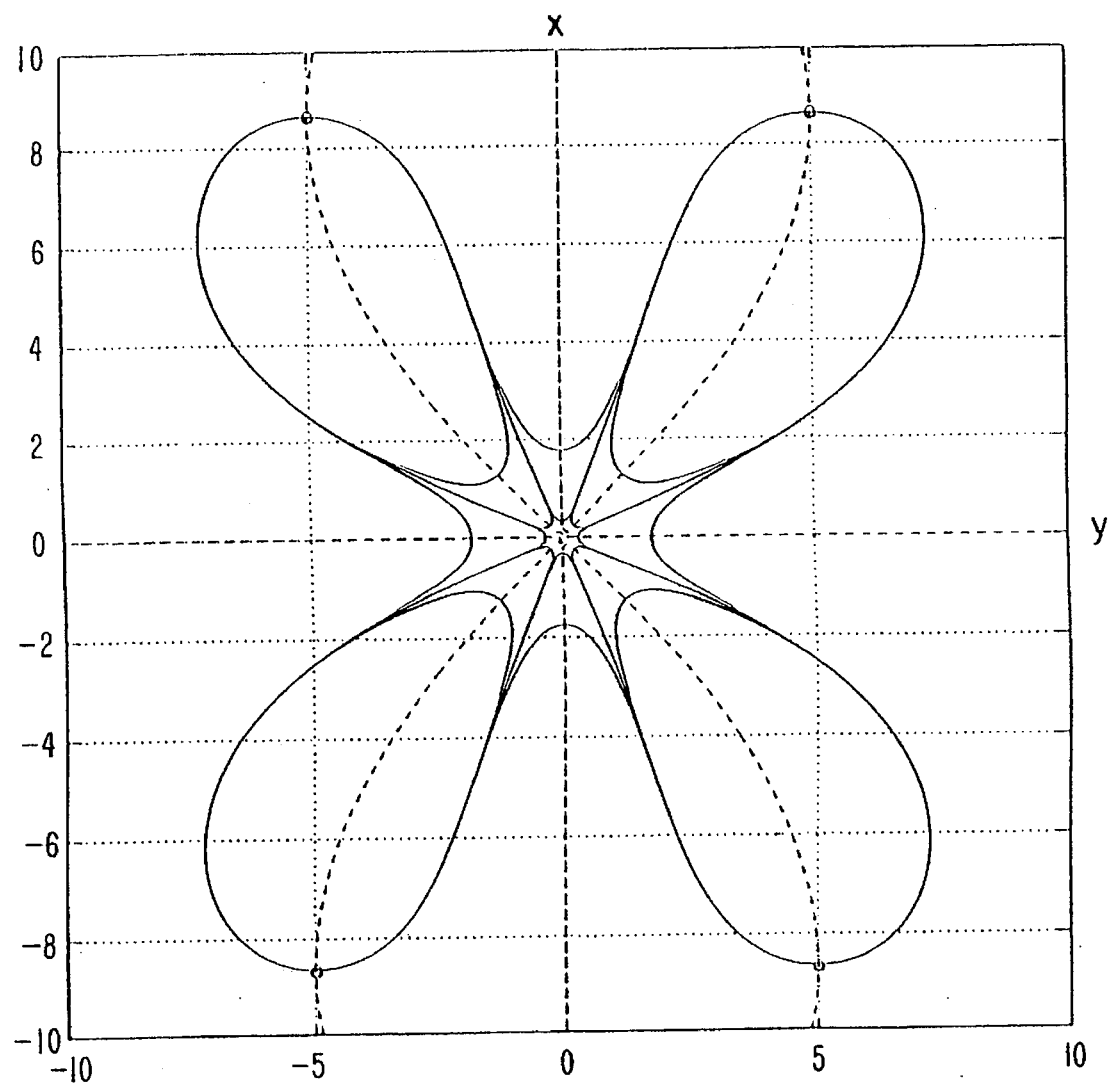
FIG. 11 shows $B_x=0$ contours (dashed) and fractional $B_y$ error contours (solid lines) for a prior art 4-wire case (small scalloped circle near the origin is for a fractional error of 1 PPM, and larger circle is for 1000 PPM)

The optimal 4-wire configuration places wires at the 30 degree marks. Morris, "Shielded four-conductor magnetic field assembly," *Rev. Sci. Instrum.* 55(9), at 1483–85 (1984). However, the region of field uniformity of 1 PPM or better is limited to a circular region of less than one-twentieth the radius of the circle on which the wires are placed (see FIG. 11). The present invention demonstrates that higher uniformity is achievable using more than four wires, which has not previously been understood.

The locations for a given number of wires that will produce the optimum dipole field for cases without wires on the x-axis can be derived by iteratively solving the following set of equations:

$$\cos[(2n+1)\phi_n] + \cos[(2n+1)\phi_{n-1}] + \ldots + \cos[(2n+1)\phi_1] = 0$$
$$\cos[(2n-1)\phi_n] + \cos[(2n-1)\phi_{n-1}] + \ldots + \cos[(2n-1)\phi_1] = 0$$
$$\cos[(2n-3)\phi_n] + \cos[(2n-3)\phi_{n-1}] + \ldots + \cos[(2n-3)\phi_1] = 0$$
$$\vdots$$
$$\cos(5\phi_n) + \cos(5\phi_{n-1}) + \ldots + \cos(5\phi_1) = 0$$
$$\cos(3\phi_n) + \cos(3\phi_{n-1}) + \ldots + \cos(3\phi_1) = 0,$$

where the $\phi_n$ are the angular locations of the wires measured from the x-axis (if the desired field is chosen to be in the y-direction), and n is the number of wires per quadrant. For example, if there are three wires per quadrant (12 wires total), there will be three equations and three unknowns (the wire angular locations) as follows:

$$\cos7\phi_3 + \cos7\phi_2 + \cos7\phi_1 = 0$$
$$\cos5\phi_3 + \cos5\phi_2 + \cos5\phi_1 = 0$$
$$\cos3\phi_3 + \cos3\phi_2 + \cos3\phi_1 = 0,$$

for which two of the solutions are $$\phi_n[11.670369701, 26.936552891, 56.056239595]$$

and $$\phi_n = [11.991978538, 41.927883486, 85.674770706].$$

Wire locations in quadrants 2, 3, and 4 are obtained by reflection across the x and y axes, with negative current in wires at negative x coordinates.

Note that the number of equations is the same in each case as the number of unknowns, so it is probable that there will be at least one solution for the optimum field for that number of wires. In most cases, there will be more than one set of wire locations that satisfy the complete set of equations for that number of wires (as in the three-wire case above, and others listed below), with field accuracy characteristics that are nearly identical.

This method also produces the locations of wires sets in which there are wires on the x-axis (for the desired field in the y direction). If the wire circle has radius R, the wire will be at coordinates (R, 0). By symmetry, there will also be a wire at (−R, 0). The wire locations for optimum fields are derived by equations similar to those above, but with the addition of a constant 0.5 in each case. For example, in the case of three wires per quadrant plus the wires on the x-axis, the equations become $$\cos7\phi_3 + \cos7\phi_2 + \cos7\phi_1 + 0.5 = 0$$

$$\cos5\phi_3 + \cos5\phi_2 + \cos5\phi_1 + 0.5 = 0$$

$$\cos3\phi_3 + \cos3\phi_2 + \cos3\phi_1 + 0.5 = 0,$$

with one solution being wires at $$\phi_n = [0, 17.040932432, 32.516510874, 58.349938749],$$

which produces three $B_x=0$ origin crossings. This system has 14 wires total. Wire locations in other quadrants are again obtained by reflection across the x and y axes, but without duplicating the wires on the x axis in reflection across the x-axis.

The simplest configuration for the case of wires on the x-axis has 6 wires total, and satisfies only the equation $\cos3\phi_1 + 0.5 = 0$, which has a solution of wires at 0 degrees and 40 degrees.

The optimum field uniformity of a given number of wires can be achieved in a large (actually infinite) number of ways by using a larger number of wires. Choosing wire angles for an n–wire/quadrant system such that the n−1 lowest order equations are satisfied and not the $n^{th}$ equation produces a field with n−1 origin crossings with the field uniformity of n−1 wires. For example, choice of wires at 6, 30 and 54 degrees in the 3-wire/quadrant (12 wire total) system produces:

$$\cos7\phi_3 + \cos7\phi_2 + \cos7\phi_1 = 0.8281759 \text{ (non-0, value immaterial)}$$

$$\cos5\phi_3 + \cos5\phi_2 + \cos5\phi_1 = 0$$

$$\cos3\phi_3 + \cos3\phi_2 + \cos3\phi_1 = 0,$$

which produces a field with two $B_x=0$ origin crossings per quadrant. Since there are two equations to solve with three variables, the number of solutions is infinite. Similarly, the 32-wire (8/quadrant) system mentioned above satisfies the lowest five equations (through $\cos(11\phi_n)$), but not the sixth, and so produces fields with five $B_x=0$ crossings.

Restriction of the wires in the solution set to the first quadrant (less than 90 degrees) is not absolutely necessary, and many solutions can be found with one or more of the specified wire angles in the second (or other) quadrant. For example, one set of solutions to the 4-wire/quadrant (16-wire) case is $$\phi_n = [11.142857143, 36.857142857, 71.142857143, 96.857142857],$$

with one wire in the second quadrant. This wire has the opposite current as the other three wires in the same quadrant, as do the wires located by reflection across the x and y axes. The system has the same field uniformity as other 4-wire optimum solutions, but is less efficient in production of field per ampere of wire current. Some of these less-efficient configurations may be chosen for other advantages, such as better stress distribution on the conductors or support structure or better interior access.

FIG. 7 shows the behavior of sets of wires placed according to the method of the invention with plots of the logarithm (base 10) of the error in $B_y$ versus position along the y-axis. The homogeneity improves very rapidly with the increase in number of wires used, with the 5-wire per quadrant set having about twice the radius of 1 PPM homogeneity as the 3-wire per quadrant set.

Figure 12:
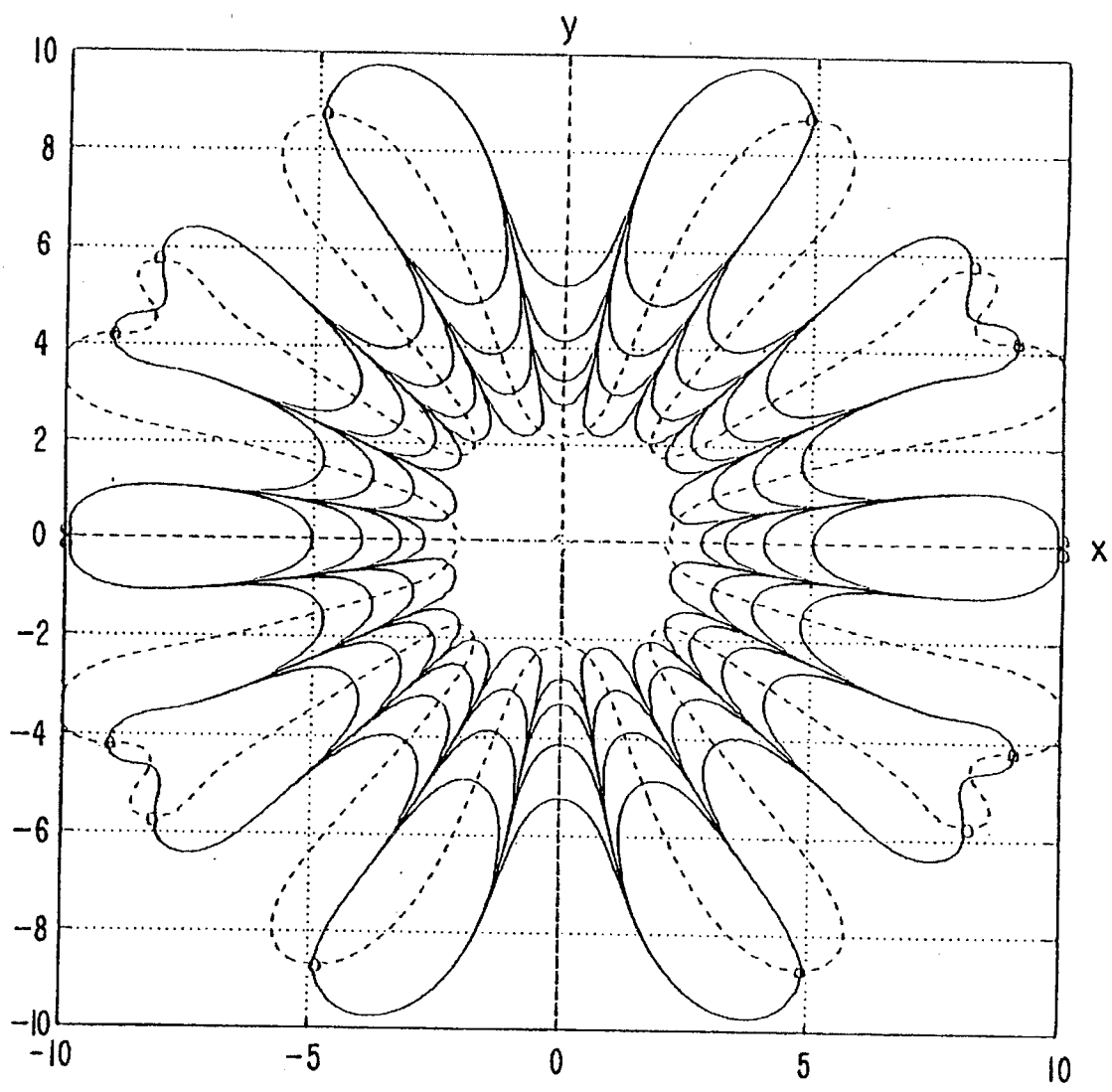
FIG. 12 shows a near-optimum 16-wire configuration derived from the case of FIG. 8 by a 30 PPM angular shift of one wire in each quadrant, and the closure of $B_x=0$ contours into loops near the origin, and minimal perturbation of the field at the 1 PPM $B_y$ fractional error level.

For the $B_x=0$ contours exactly to cross the origin, the wires must be perfectly located. If the wires are slightly off-position, the $B_x=0$ contours do not cross the origin, but close in loops near the origin. The field at radii greater than this $B_x=0$ contour loop closing has characteristics that correspond to the perfectly-located configuration. Fields at radii smaller than the approximate circle through the smallest radius extent of the contours are not well-behaved. However, the fields inside this radius have uniformity characteristics that are no worse than the uniformity at that transition radius. For example, FIG. 12 shows the 16-wire case of FIG. 8 with a perturbation of 30 PPM of one of the wires in each quadrant. The $B_x=0$ contours (dashed) form a closed contour with loops near the origin. The solid lines are contours of constant $B_y$ fractional error at 1, 10, 100 and 1000 PPM. The contour of 1 PPM is approximately at the radius of closure of the $B_x=0$ contour loops, and is slightly perturbed. There are no contours of $B_y$ error greater than 1 PPM at radii smaller than the 1 PPM contour, showing that the field in that region has accuracy of at least 1 PPM. This allows manufacturing tolerances to be adjusted for the specific application without danger of having regions of uncontrolled field, and shows the utility of the $B_x=0$ contour plots in the design of these systems.

Figure 13:
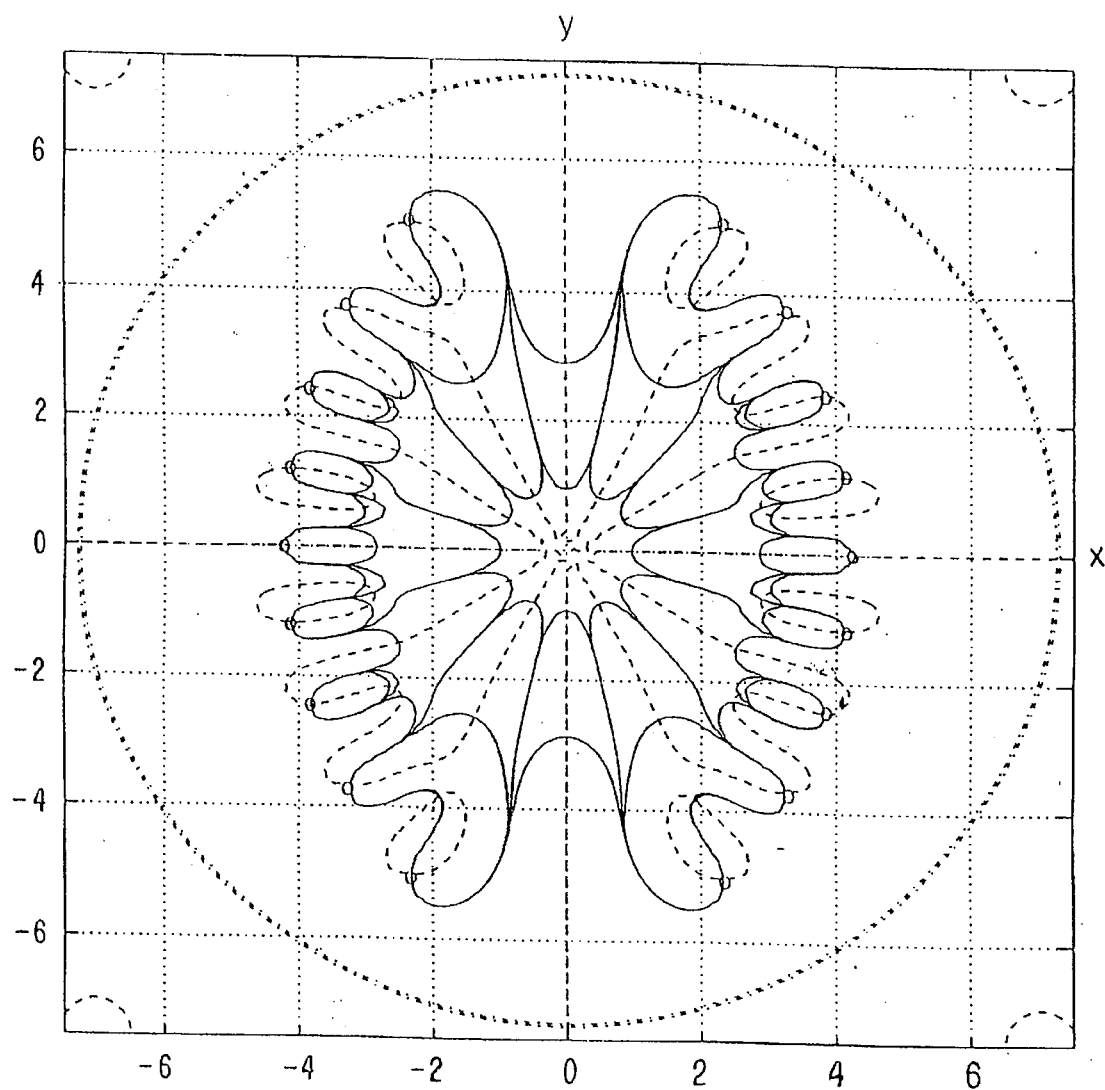
FIG. 13 shows contours of $B_x=0$, and 1 PPM (inner scalloped circle) and 1000 PPM (scalloped ovoid near the wires) for an 18-wire ovoid embodiment with a ferromagnetic shield (outer dash-dot circle)

An example of a set of wires in an ovoid configuration is shown in FIG. 13. The wire locations were derived by iteration using the $B_x=0$ origin crossing patterns. This system includes a ferromagnetic shield (discussed further below), whose location is indicated by the circle around the wire set. The set is not optimized, with only two $B_x=0$ contour origin crossings per quadrant (dashed lines), but still has excellent field uniformity characteristics. The solid contours shown are $B_y$ fractional error of 1 PPM (inner scalloped circle), and 1000 PPM (next larger roughly circular scalloped circle).

In all the right-circular-cylindrical configurations of the present invention, the uniformity characteristics of a given wire set are independent of the radius of the wire circle. If the wire circle radius is doubled, the field plot appears exactly the same, but inflated in both x and y dimensions by a factor of two, and the field magnitude everywhere is decreased by a factor of two if the wire current has not changed. This characteristic allows the use of superposition of many wire sets that are identical except for radius. That is, to achieve a larger conductor size for larger currents, it is not necessary to use larger radius wires, but to simply parallel many wire sets. This concept can be extended to blending the wires into plates or current sheets that extend radially outward at the proper wire angle, to reduce resistance.

Figure 4B:
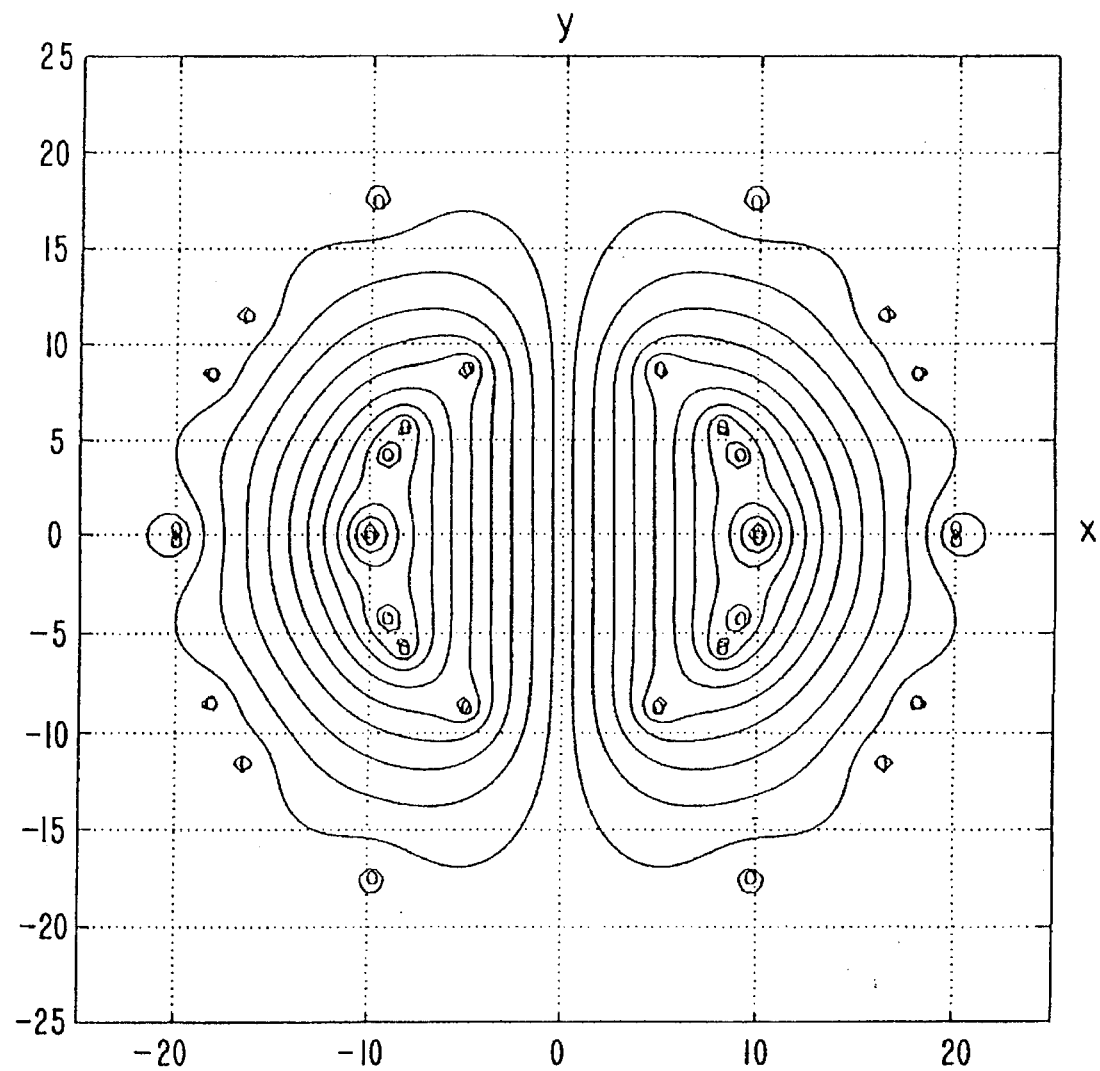
FIG. 4b shows field lines for a 16-wire configuration of the present invention with field cancelation.
Figure 5:
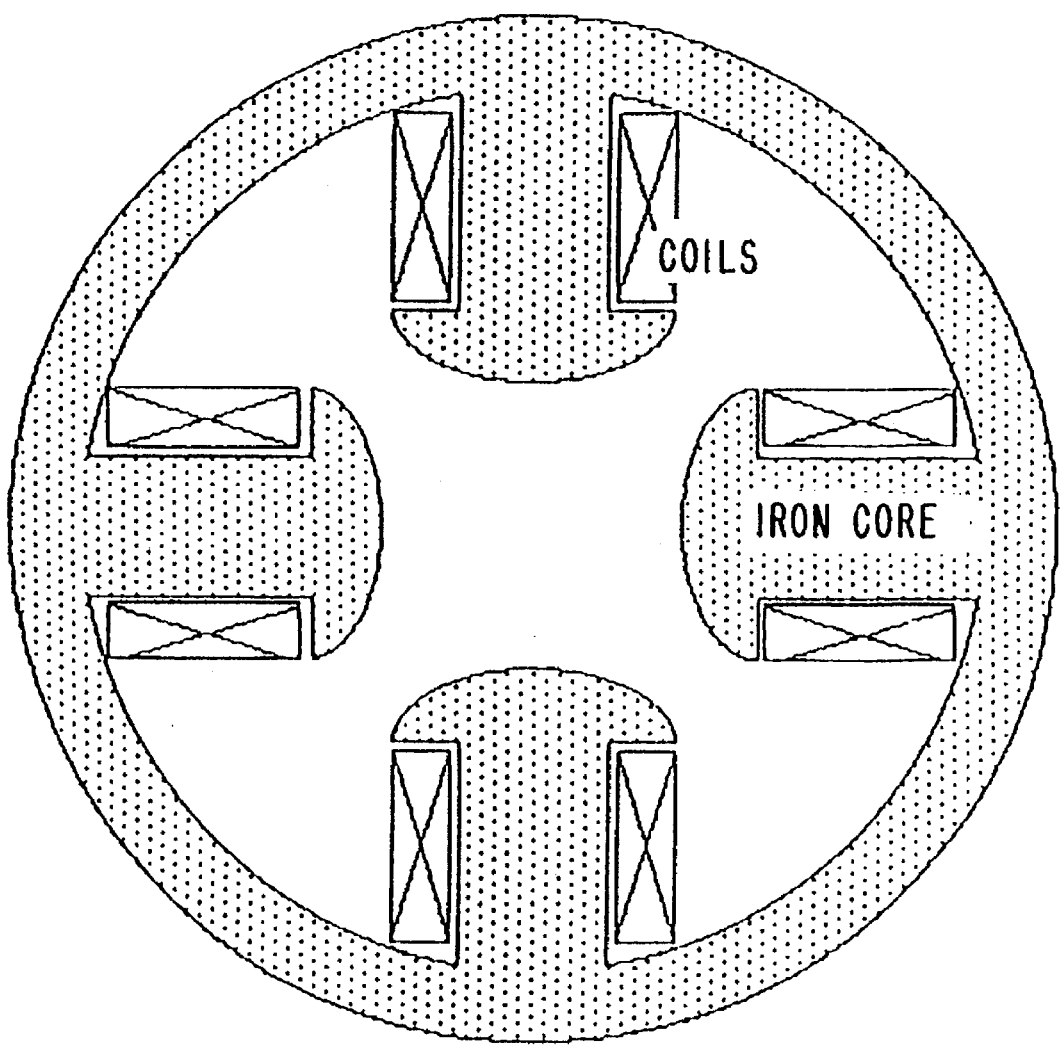
FIG. 5 shows a prior art quadrupole iron core magnet typically used for charged particle beam focusing, with interior faces of the cores precision ground to hyperbolic shape to optimize the field.
Figure 6:
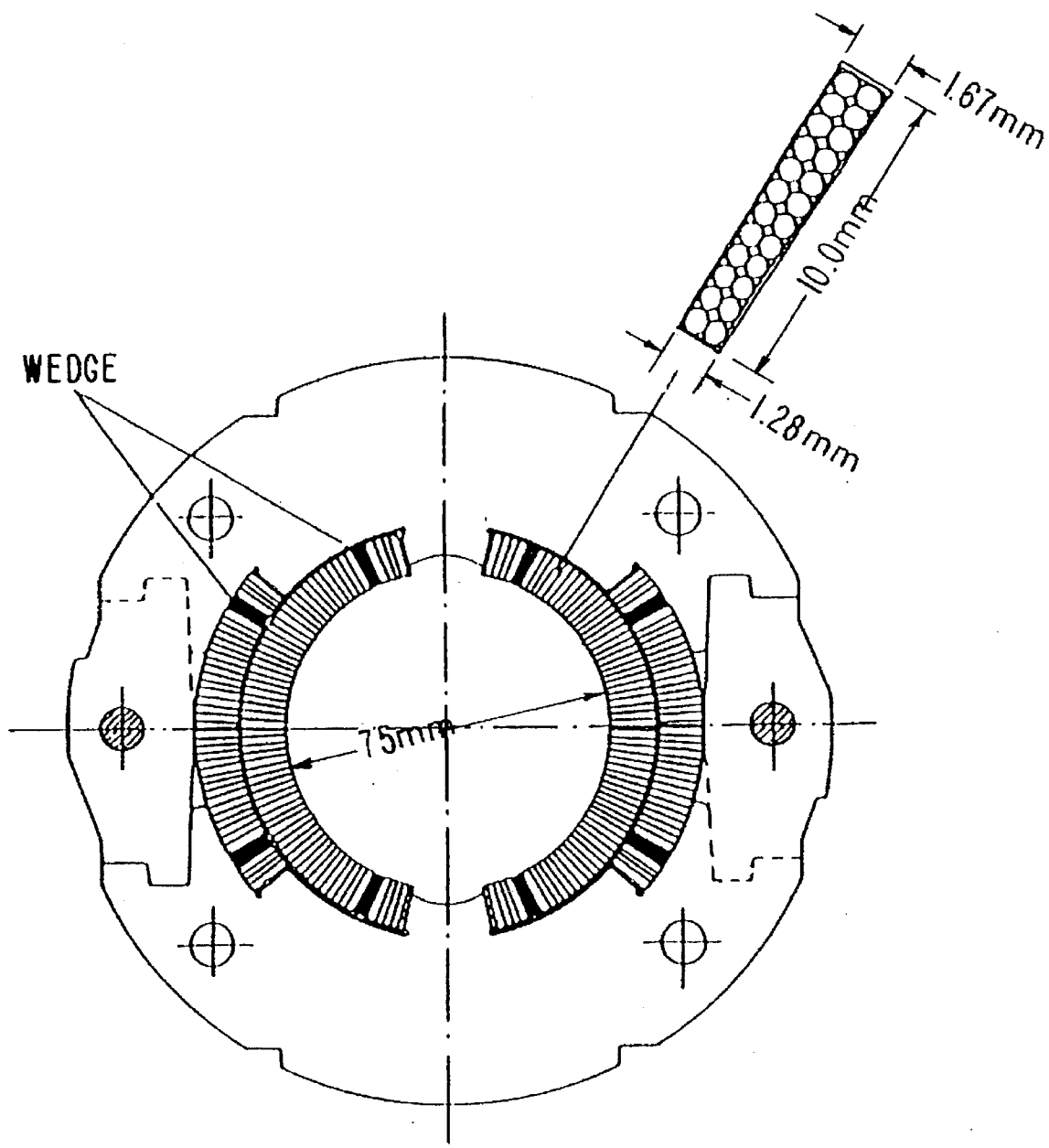
FIG. 6 shows a prior art two-shell air core dipole magnet that approximates a $\sin(\phi)$ angular current distribution, which is used in many high-energy particle beam accelerators.

As discussed above, a wire set with wires on a larger radius circle but identical in angles to a primary field-generating wire set will not affect the field uniformity of the primary wire set, but the choice of current directions can produce fields that either aid or oppose the fields of the primary wire set. If the currents on the outer set oppose the primary wire set currents, and have the proper magnitude, the fields generated by the combined wire sets external to the system decrease very rapidly. The outer wire set can be at any radius, but for optimum cancellation of external fields must have wire currents that are the currents in the primary (inner) wire set multiplied by the ratio of the radius of the inner wire set to the radius of the outer wire set. That is, if the inner set has a radius of 1 and the outer set a radius of 2, the current in the wires of the outer set is half the current of the wires on the inner set, and opposite in direction. FIG. 4b is a plot of field lines for a 16-wire (in the core field conductive pathway set) case, showing the field lines confined between the inner main wire set and the outer field-canceling set of wires.

Since the field of the outer set decreases the field in the useful region, the total current must be increased to achieve a given field. This inefficiency is the cost of the external field cancellation. In the above example, the current in the outer set is half the current of the inner set, and the radius is double, so the outer set reduces the field of the inner set (in the useful region) by one-fourth from the value without the field cancellation coils. To regain the previous field magnitude, the current in both sets must be increased by one-third.

The use of the outer field canceling coils converts the system from a linear dipole whose external fields decrease as i/r: to a multipole whose order depends on the number of wires in the system. For a 16-wire set (plus 16-wire field canceling coils), the fields fall off approximately as $r^{-12}$ with distance from the system center outside the field canceling coils. At four times the radius of the primary set, the field is decreased by a factor of $10^4$ from the field at the system center.

The use of the outer set of field-canceling coils has the penalty of increased current requirements for a given desired field strength, with increased power dissipation in resistive systems, and somewhat increased size and complexity. The return is open geometry because of no (or minimal) traditional shielding requirements, easy access, and a reduction in site cost and complexity for large, high-field-strength systems. However, a traditional shielded system may have an advantage in some cases, particularly in small, resistive systems, or for very-high-field-strength systems where efficiency is a primary concern and a light, open geometry is less important. In such cases, the right-circular-cylinder transverse-field system preferred under the present invention has the advantage that a coaxial cylindrical ferromagnetic shield around the primary conductors does not affect the field homogeneity. The shield must be located far enough from the conductors that it does not approach saturation at any point, because that would produce nonlinearities and field distortions. For low-field-strength systems, the shield cylinder can be near the primary conductors, which in this case significantly enhances the efficiency, because the virtual (image solution) currents due to the shield are in the same direction as the actual currents in the conducting pathways, enhancing the field in the core region. In the case of ovoid or other non-circular cylindrical wire sets (rather than circular), the shield does affect the field uniformity, and the iterative method of $B_x=0$ origin crossings can be used to locate the wires.

A conductive cylinder may be used for shielding the circular systems of the present invention if the system currents are pulsed or vary at a rate such that the magnetic field skin depth in the shield is small compared to the shield thickness. The field inside the shield is again calculated with the method of images, but in this case the image currents in a conducting cylinder are such as to oppose the core field, so this form of shield decreases the system efficiency. As with the ferromagnetic shield, the conductive cylindrical shield does not adversely affect the homogeneity of the interior field.

Figure 14A:
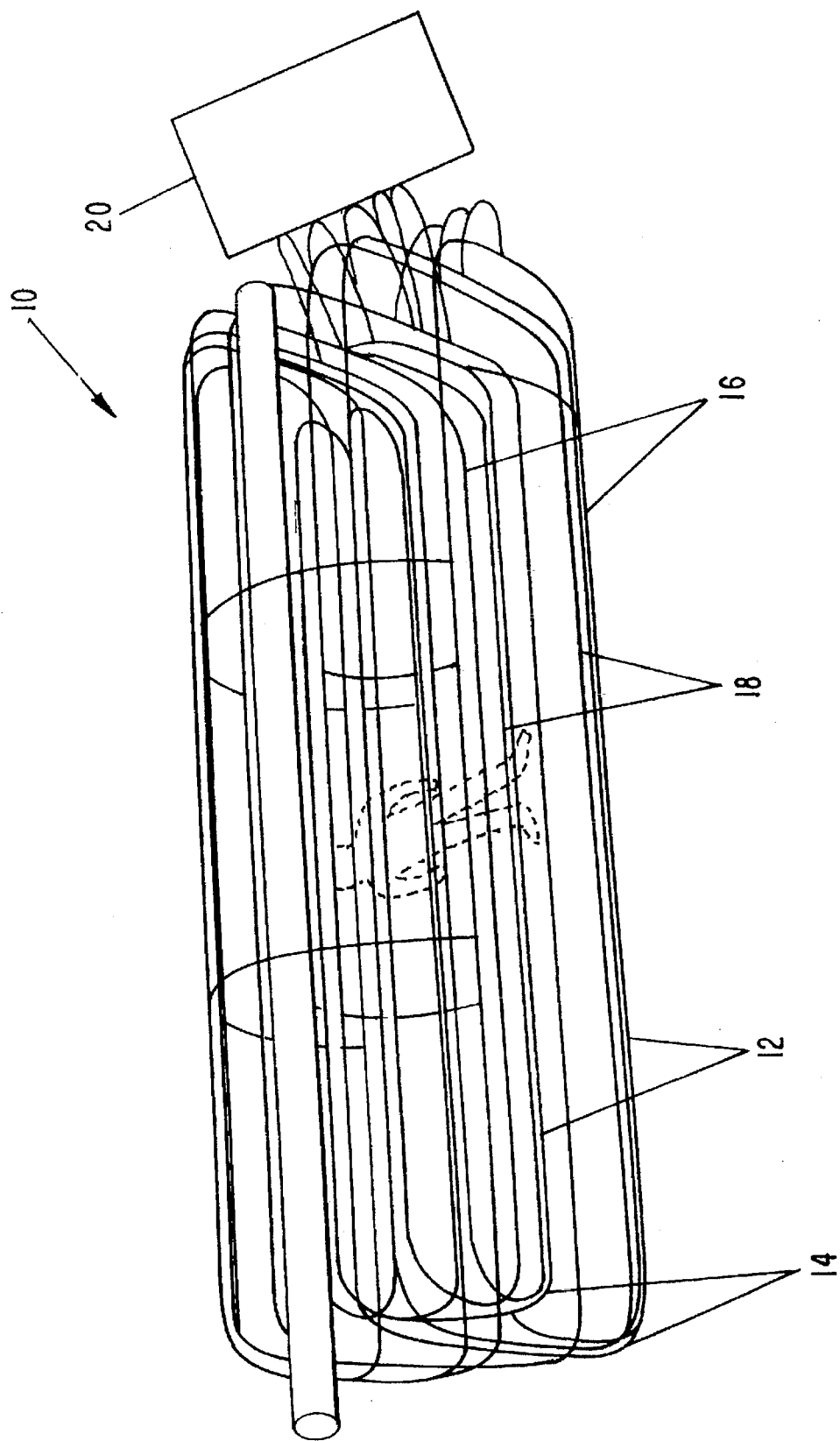
FIG. 14a is a perspective view of the preferred apparatus of the uniform-magnetic-field embodiment of the invention employing field cancellation and a homopolar generator to provide pulsing.
Figure 14B:
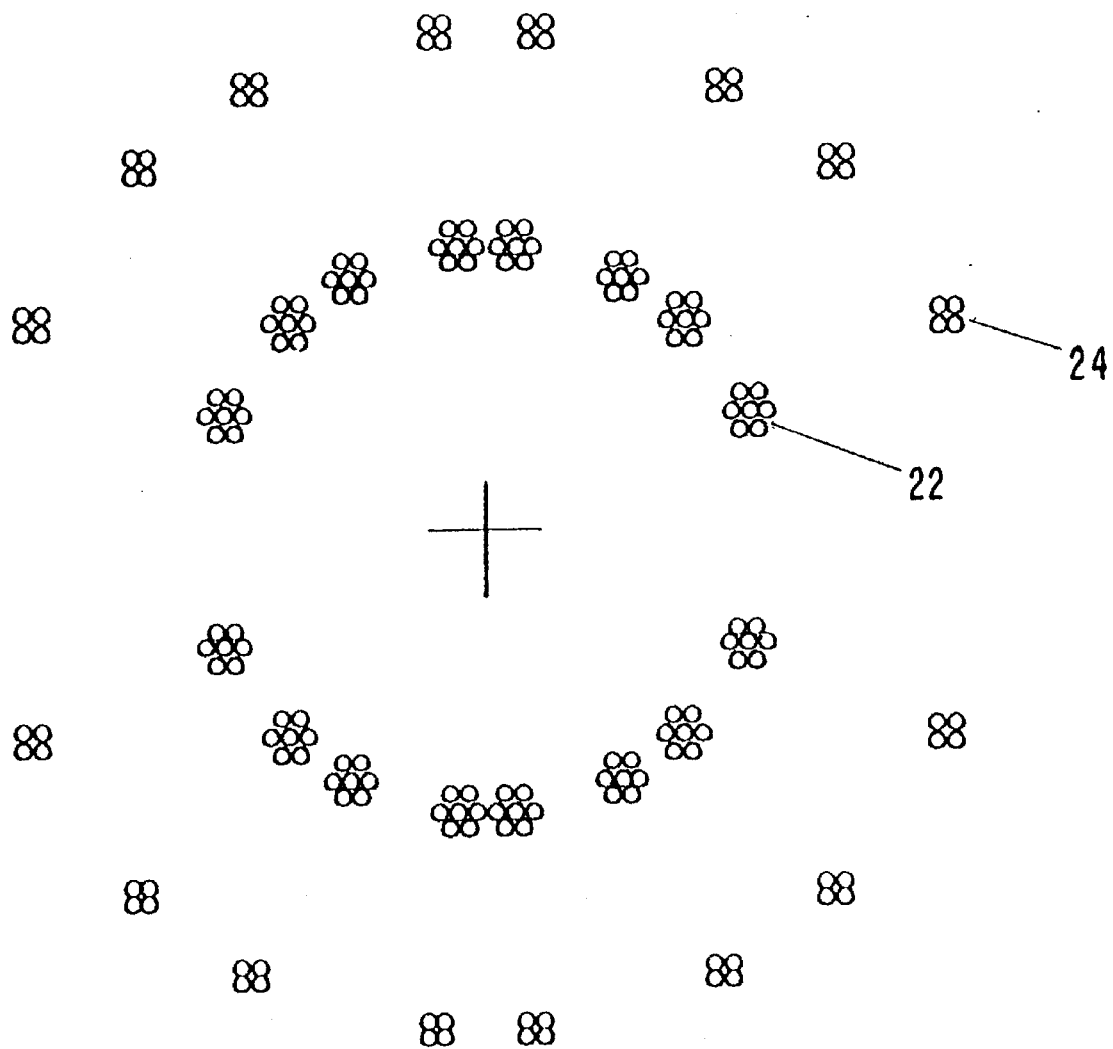
FIG. 14b illustrates the preferred use of multiple wires within the conductive pathways for both field generation and field cancellation.
Figure 14C:
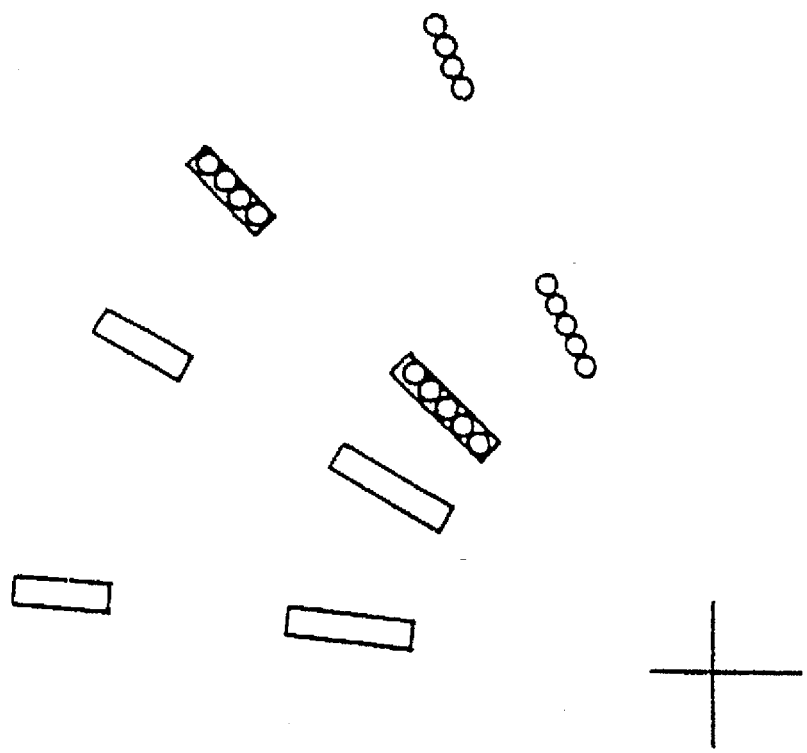
FIG. 14c illustrates the use of current sheets to provide both field generation and field cancellation.

Referring to FIG. 14a, in the preferred uniform field generation apparatus 10 of the present invention, the line currents 12 are closed at the ends 14, forming long roughly rectangular loops 16 with straight sides 18. Power and pulsing capability is provided by a high-stability power supply, or, in the case of pulsed fields, a homopolar generator 20. The rectangular loops may be composed of one or many turns of wire, and may be resistive or superconducting. The external field cancellation circuits are also closed at the ends. Referring to FIG. 14b, the same current supply (preferably fully series, both primary and field cancellation coils) can be used in both sets of conductors if the inner (primary) set is composed of loops each having n wires 22, with the field cancellation loops having m wires 24, with the radii of the two sets related as $R_{cancel}=(n/m)R_{primary}$, and the currents in the two sets related as $I_{cancel}=(m/n)I_{primary}$. The series circuit insures that the currents are exact for optimal internal field homogeneity and external field cancellation. Separately controlled currents in each loop or leg (parallel circuits) may be used, with sufficient current regulation accuracy. Referring to FIG. 14c, current sheets 26 may be used to provide both field generation and field cancellation currents.

Figure 15:
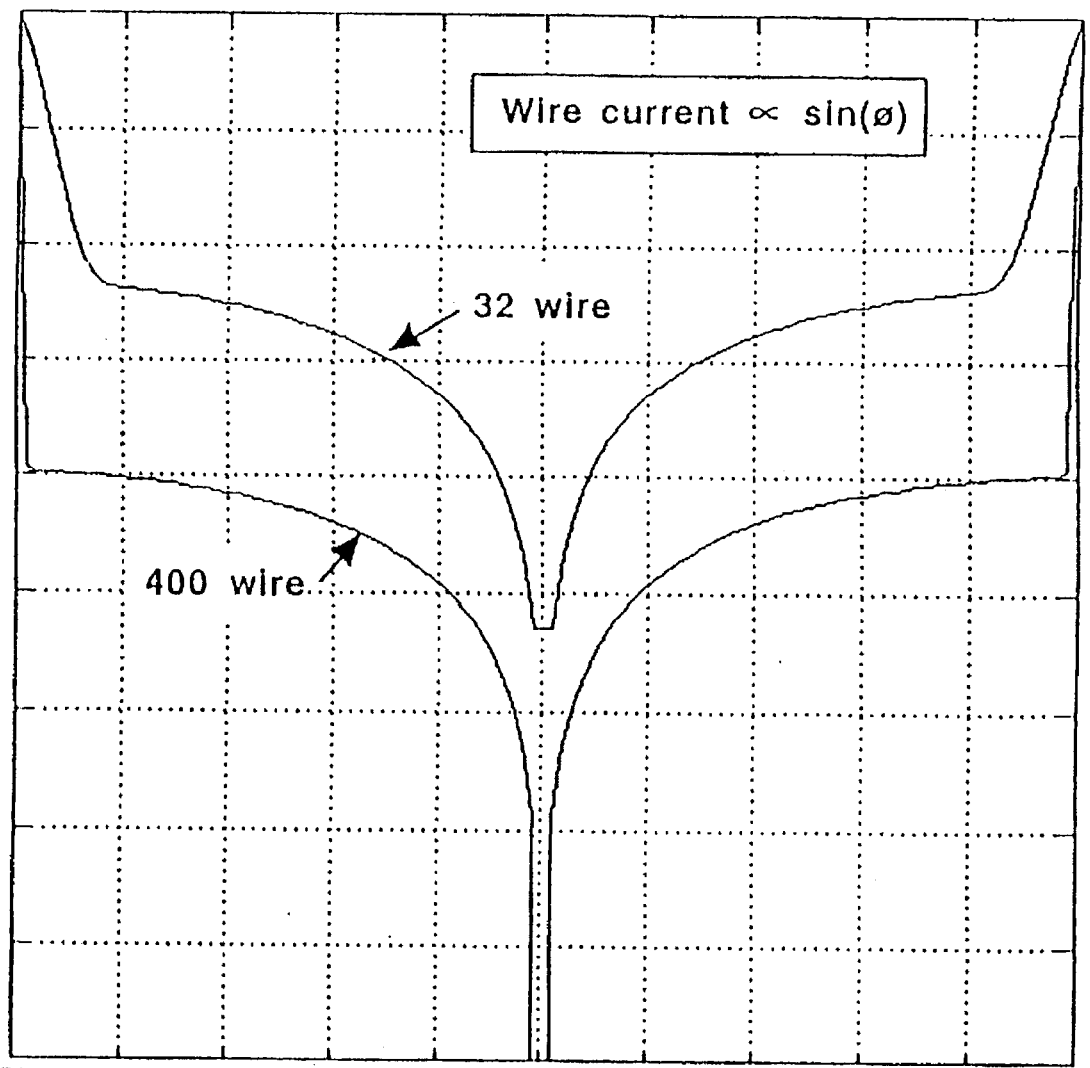
FIG. 15 is a graph identical to that of FIG. 4 for 8 and 100 wires per quadrant employing the prior art method of locating wires using I=I₀sin(φ)

A surface current distribution on a straight cylinder that varies as $I=I_o\sin(\phi)$ will produce a uniform field inside the cylinder. Peterson, "Nuclear Research Magnets", *Proceedings of the Int'l Conference on High Magnetic Fields* ch. 88 at 726–36 (MIT Press, 1961). This surface current distribution can be approximated by wires carrying equal currents whose angular locations vary as $\sin(\phi)$. However, the discrete wire approximation converges very slowly. FIG. 15 shows the homogeneity results for 8-wire per quadrant (32 wire total) and 100-wire per quadrant (400 wire total) optimized sinusoidally-distributed sets, for comparison with the sets of the invention whose results are shown in FIG. 7. In FIG. 15, there is a negligible region of 10 PPM homogeneity in the 32-wire set, and only a small region in the 400-wire set. The sinusoidal method (and apparatuses based thereon) is impractical for the high accuracy required by many applications of uniform magnetic and/or electric fields. In any case, for a given number of wires the optimum configurations of the present invention always produce a field that is superior to the $\sin(\phi)$ field. Also, field cancellation by an outer set of cancellation coils is much more effective (a factor of 10 or more at a given radius) in the present invention than in the $\sin(\phi)$ case.

The transverse field system of the present invention requires only a small number of conductors to produce highly uniform fields over a large area. These conductors (preferably rectangular loops) can be constructed of few or many turns, with the system tradeoff being current versus inductance. An inductance can be achieved that is very small compared with solenoidal systems, allowing a pulsed field to be efficiently produced with moderate voltages. Uses of pulsed systems according to the present invention in particular applications are discussed below.

The present invention is particularly useful in magnetic resonance imaging (MRI) applications. For MRI applications, the necessary field homogeneity over the volume of interest (a cube about 40 cm per dimension) is approximately 10 PPM, with field strengths ranging from 0.05 T to 2 T. These fields are traditionally provided by solenoids, resistive for low fields and superconducting for high fields. The transverse field system of the present invention provides the necessary homogeneity but provides several advantages over a solenoid-based system. Access to the homogeneous field region at the center of a solenoid must be made through the ends, which must be left open. Magnetic fields of a solenoid decrease relatively slowly with distance. Shielding of the external environment from these fields is an important and expensive part of the system installation. Shielding is heavy, and must be located far enough away that perturbations of the core field can be corrected by shim coils. Loose iron or steel objects near the magnet are accelerated strongly towards its core, creating a severe safety hazard. Moving conductors will have currents induced by the stray fields. Because the field lines extend well outside the solenoid system, external objects also perturb the core field of the magnet, affecting the imaging process. Because of these effects, the high-field (greater than 1 T) systems are generally located outside the hospital environment, and often in relatively remote locations.

Figure 1:
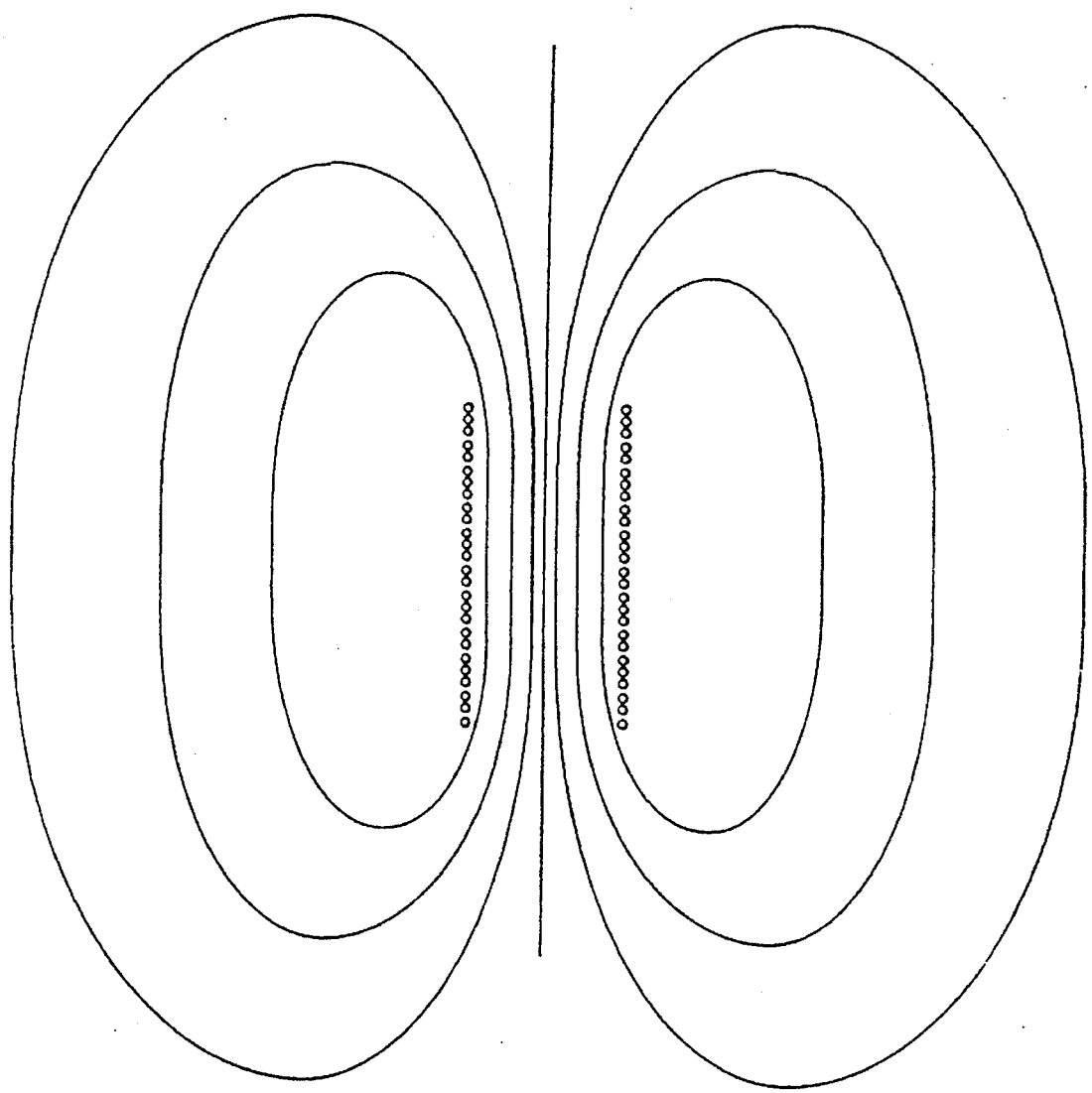
FIG. 1 shows in cross-section the field lines of a prior art solenoidal magnet closing at large distances outside the solenoid.
Figure 2:
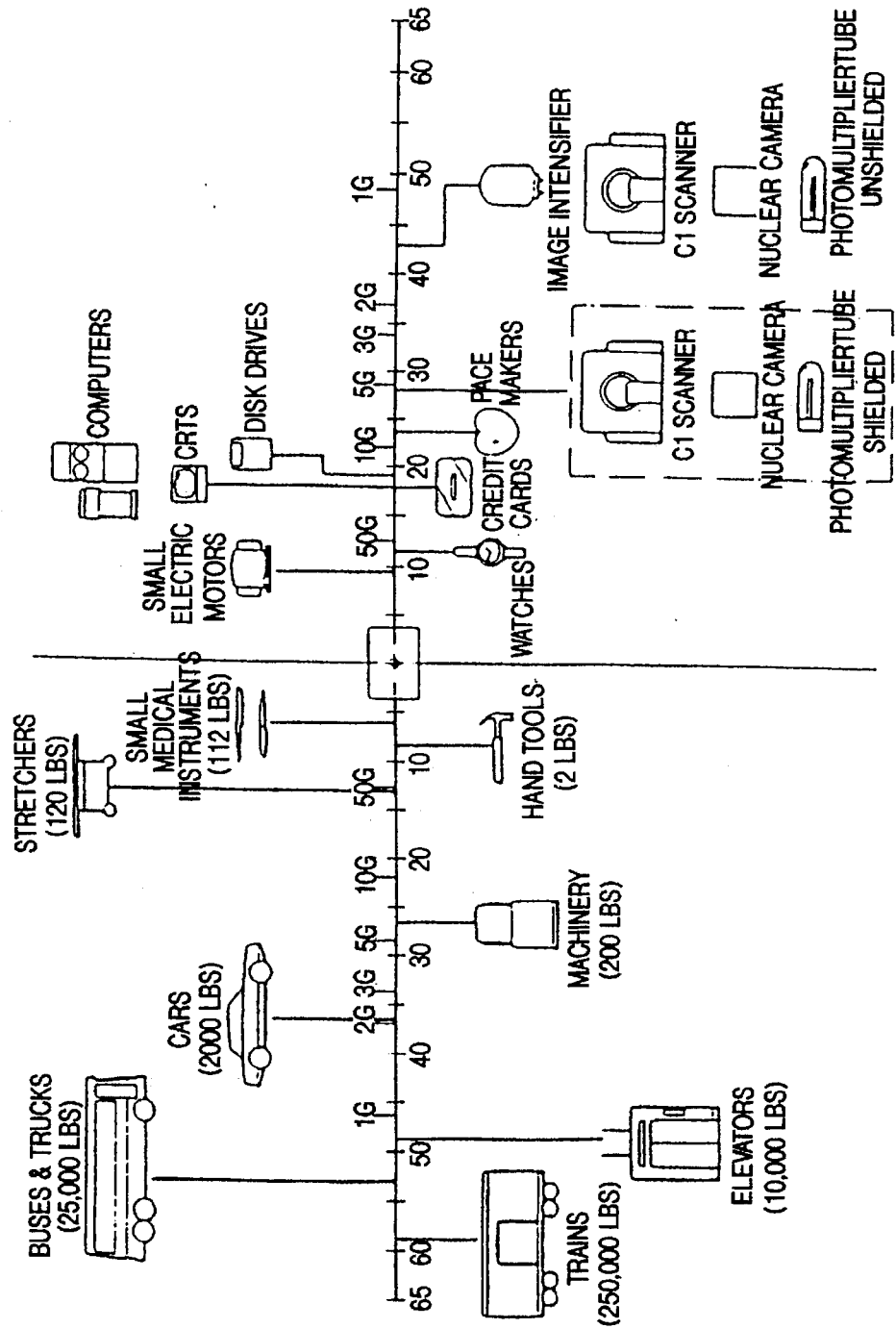
FIG. 2 shows the range of the field and recommended minimum distances for various items from a conventional 0.5 T solenoidal magnet for medical MRI applications.

Systems according to the present invention with field cancellation coils have fields that decrease very rapidly outside the system, even without shielding. The field lines in the center connect entirely within the system of coils, and external objects are not accelerated toward the core. Perturbation of the field by external ferromagnetic objects is virtually eliminated. The 5 G surface (Food and Drug Administration maximum for unrestricted access) is less than two meters (2 m) radially from the center of a 2 T, one meter (1 m) core diameter transverse field system. This can be compared with the 0.5 T system of FIG. 2, where the 5 G magnitude is at 8.5 m (28 ft) from the magnet center; if this system were increased in field strength, the 5 G magnitude would be nearly 14 m (46 feet) from the magnet center. The greatly reduced shielding needs result in a much lighter system and reduced site costs, thus rendering it more feasible to locate the system within hospital buildings.

Figure 3:
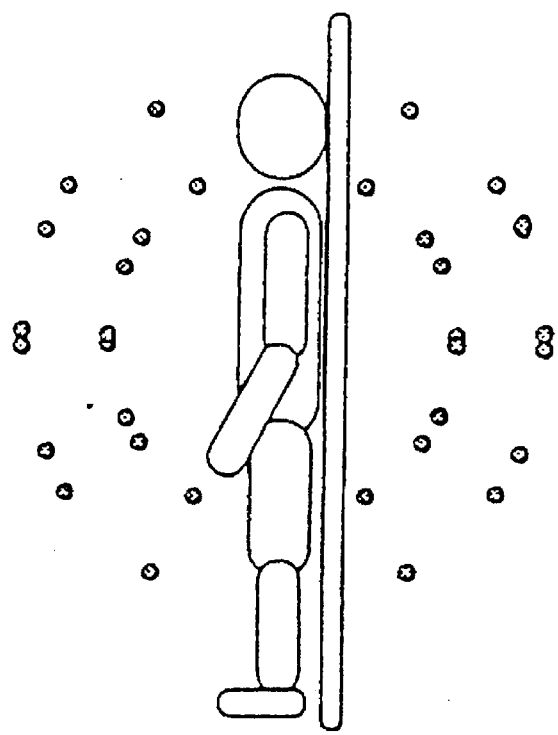
FIG. 3 schematically illustrates a configuration of the present invention in an MRI application permitting access for patients along and across the magnet.
Figure 3:
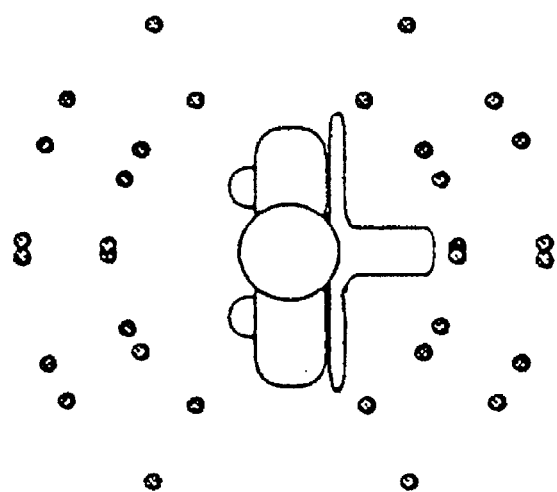

The ends of the preferred embodiment are closed by the continuation of the conductive paths, and patient access is through the large gap along two sides of the field coil assembly in particular configurations of the present invention (see FIG. 3). This gap is a natural part of the conductor assembly, and is not a perturbation on the core field or a source of field leakage. Persons to be scanned can be entirely within the core, along the long axis, or across the long axis. The minimum length of the system (along the axis) depends on the length necessary for adjusting the field homogeneity along the axis. The cross position possible with the present invention allows the possibility of short, compact, lower-cost systems for scanning limited regions, for limbs or for mammography, for example.

Forces on the conductor system of the present invention will on the average be the same as in a same diameter solenoid at the same field, but forces are concentrated more on the smaller number of conductors. Forces on conductors in a one meter interior diameter, one Tesla system are about 20,000 pounds per foot of length, which would produce approximately 0.010 inch deflection in a one inch steel rod supported at 18 inch intervals. These are manageable levels of force, although in some areas of a high field magnet, it may be necessary to trade some of the openness of the system for strength. The forces decrease as the square of the magnetic field strength, so a medium-field MRI system of 0.2 T would have 1/25 the stress.

The preferred embodiment is open, with visual and instrument access through the large side openings and between conductors. The solenoid-based MRI units presently in use are solid-wall tubes, with open ends. MRI scans of some patients are impossible because of claustrophobic reactions to the confined bore of the solenoid. The transverse-field system of the present invention reduces this difficulty, being much more visually open, and its reduction of external fields without shielding can allow closer access to patients by others (particularly important with children).

Magnets for conventional MRI systems are on continuously, or at least for long periods, because imaging times are several minutes. Closed-loop superconducting magnets have the added advantage of long-term current (and therefore magnetic field) stability. Parallel processing computer technology will soon allow image acquisition times to drop to a few seconds, and so the relatively low inductance of the present invention makes long-pulse resistive magnets useful, preferably driven by homopolar generators or similar pulsers. This eliminates the initial and maintenance costs of cryogenics, which add significantly to the costs of an MRI system.

The present invention is also useful with nuclear magnetic resonance (NMR) and chemical shift spectrometry and imaging. The resolution required for NMR can require field homogeneities approaching 1 part per billion. The present invention is well behaved, and has a large region of this level of field accuracy, assuming the conductors are located and kept in position with the needed accuracy. As noted above for MRI systems, the present invention is much more immune to perturbations by external objects than solenoidal systems, and the relatively small number of individual separate conductors makes it possible to tune the field by position adjustment of the conductors during construction and/or installation. Alternatively, small independently adjustable currents can be located along the primary conducting loops. The open geometry is an advantage for instrument and sample-positioning access.

Figure 16:
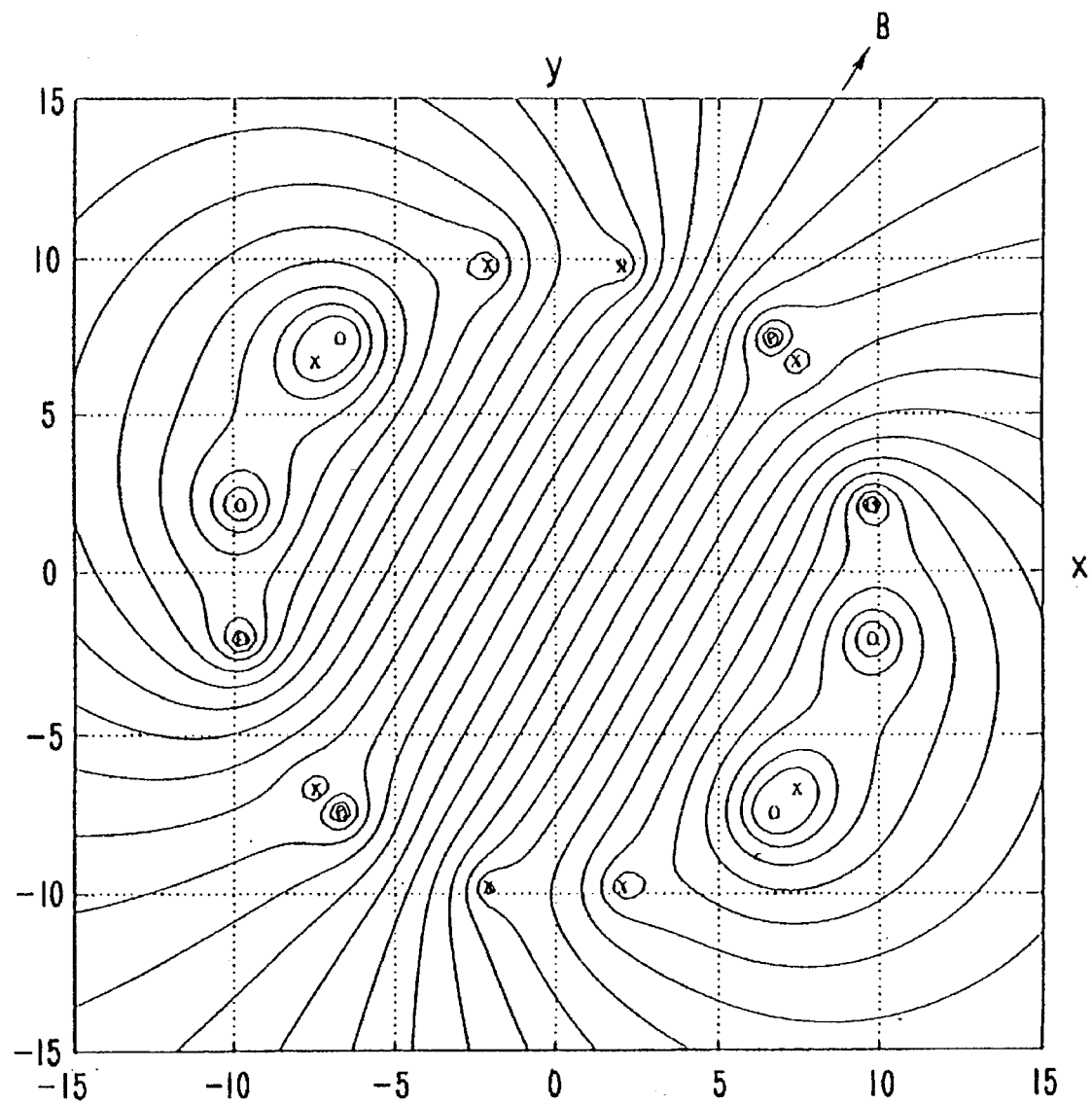
FIG. 16 shows field lines for a dipole embodiment of the present invention whose uniform field can be caused to rotate in time (shown at 30° rotation)

Another embodiment of the invention provides for field rotation in time. By combining two identical wire sets such that both have the same longitudinal axis, but with one set rotated 90° with respect to the other, a system is produced in which the field vector can be rotated by adjusting the relative currents in the two wire sets. Since the area of uniformity of field or gradient is independent of the current, the combined system retains the uniformity of a single wire set. Furthermore, if the two sets are fed with sinusoidally-time-varying power supplies that are 90° out of phase (sine and cosine) they will produce a field with the original uniformity characteristics whose field vector direction rotates in time at the frequency of the applied currents. The magnitude of the field is unchanged if the peak currents in each of the two sets is identical. FIG. 16 shows lines of B for such a pair of 8-wire sets (one set indicated by "o" symbols, the other by "x" symbols) combined with the sinusoidal currents at a time when there is a 30° rotation.

Figure 17:
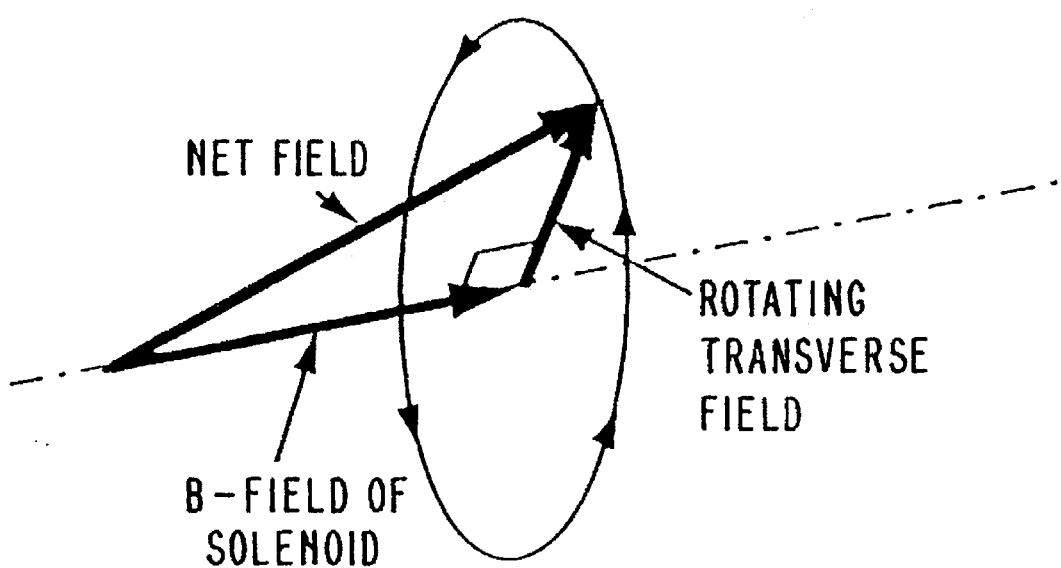
FIG. 17 is an illustration of the combination of rotating angled field vectors obtained by combining the rotating field of FIG. 16 with the field of a solenoid wound around the wire cylinder axis.

The system of rotating fields can be further adapted to produce a field vector that has a constant component in the longitudinal (z) direction by combining the two transverse-field sets described in the previous paragraph with the field of a solenoid wrapped around the two systems. Increasing the current in this solenoid superposes a constant z-component on the magnetic field, which adds to the rotating component in the cross-section plane. The net field vector at a point in the interior of the device thus sweeps out a cone as it rotates, as illustrated in FIG. 17. Changing the ratio of the peak currents of the sinusoidally varying, transverse-field supplies will produce a cone that is flattened, rather than right-circular; that is, the field magnitude will vary as the field vector rotates. This can have application in establishing spatial gradients for imaging.

A rotating dipole field, either electric or magnetic, has application in a time-resolved charged particle momentum or energy analyzer. A beam whose energy varies with time that passes through a rotating transverse field will trace out a curve on exiting the field. Given knowledge of the field values, a time-resolved record of the beam energy (electric dipole) or momentum (magnetic dipole) is obtained. The advantage of the present invention is its low capacitance and inductance, which allows high frequency rotation of the field.

The rotating-field configurations are particularly useful in NMR and in chemical shift spectrometry and imaging. The low inductance of the system allows field vector rotations at high frequencies. To achieve the required high field accuracy, the two orthogonal wire sets must be driven by currents that are orthogonal in time (sine and cosine dependence on time) and have phase and peak current accuracies comparable to the field accuracy desired. These orthogonal currents may be achieved with two separate high-accuracy power supplies combined with an active phase and amplitude sensing and correction system, or may be achieved with a single supply by coupling the two orthogonal sets with appropriate capacitors in a resonant system to produce the orthogonal currents. The rotating-field system can also include external field cancellation, just as do the static field configurations. The field-cancellation coils companion to a wire set are duplicated from the wire set and rotated 90° to provide cancellation for the fields generated by the orthogonal set.

The invention may be extended to produce fields that are uniform both magnetically and electrically. This is useful in charged-particle-beam energy analyzers and other beam handling uses. Making the uniform E-field requires that magnetic current configurations be replaced by a system whose line charges (not potentials or voltages) are identical. The method for achieving this is to calculate the potential needed on each conductive pathway to produce that charge, and build a system to regulate those different potentials. The presence of the conductors of a magnetic field system changes the charge/potential relationship of the E-field system. It is necessary to calculate the potential distribution on a set of conductors with given charges. This is a two-dimensional calculation, not three. It is not necessary to identify new conductive pathway configurations, only the potentials that will produce the desired charges on the conductive pathways that are at positions identified by the above methods.

Mass spectrometers and charged particle analyzers require a uniform magnetic field transverse to the direction of the charged particle beam to be measured. The higher the uniformity of the transverse field, the better the resolution of the instrument. The transverse field system of the present invention offers very high uniformity compared to existing systems, as well as the option of pulsing to high fields. The method of locating conductors in the present invention produces analyzers with E parallel to B, or E rotated 90° to B. The electric fields in these types of analyzers are presently produced by parallel plates, which must be close together to obtain high uniformity near the center, where the beam passes. The present invention produces highly uniform electric fields over a large circular cross-section of a cylinder.

Uniform magnetic fields perpendicular to a tube axis are used as beam-turning fields in various types of charged-particle accelerators. In these systems, field nonuniformities tend to heat the particle beam, so large area uniformity is important.

In a practical application of the present invention, the currents must be supplied to the wires such that the wire currents are identical. A convenient way to do this is to configure the system into rectangular loops with all loops in series. This is not the only possibility, however. Wires may be fed individually with separate current supplies, or the two halves of the dipole set (the wires at positive x being one half and the wires at negative x being the other) may be fed with separate supplies. There is an advantage to this in uniform-field applications where a slight field gradient in the x-direction is desired (discussed below).

Figure 18:
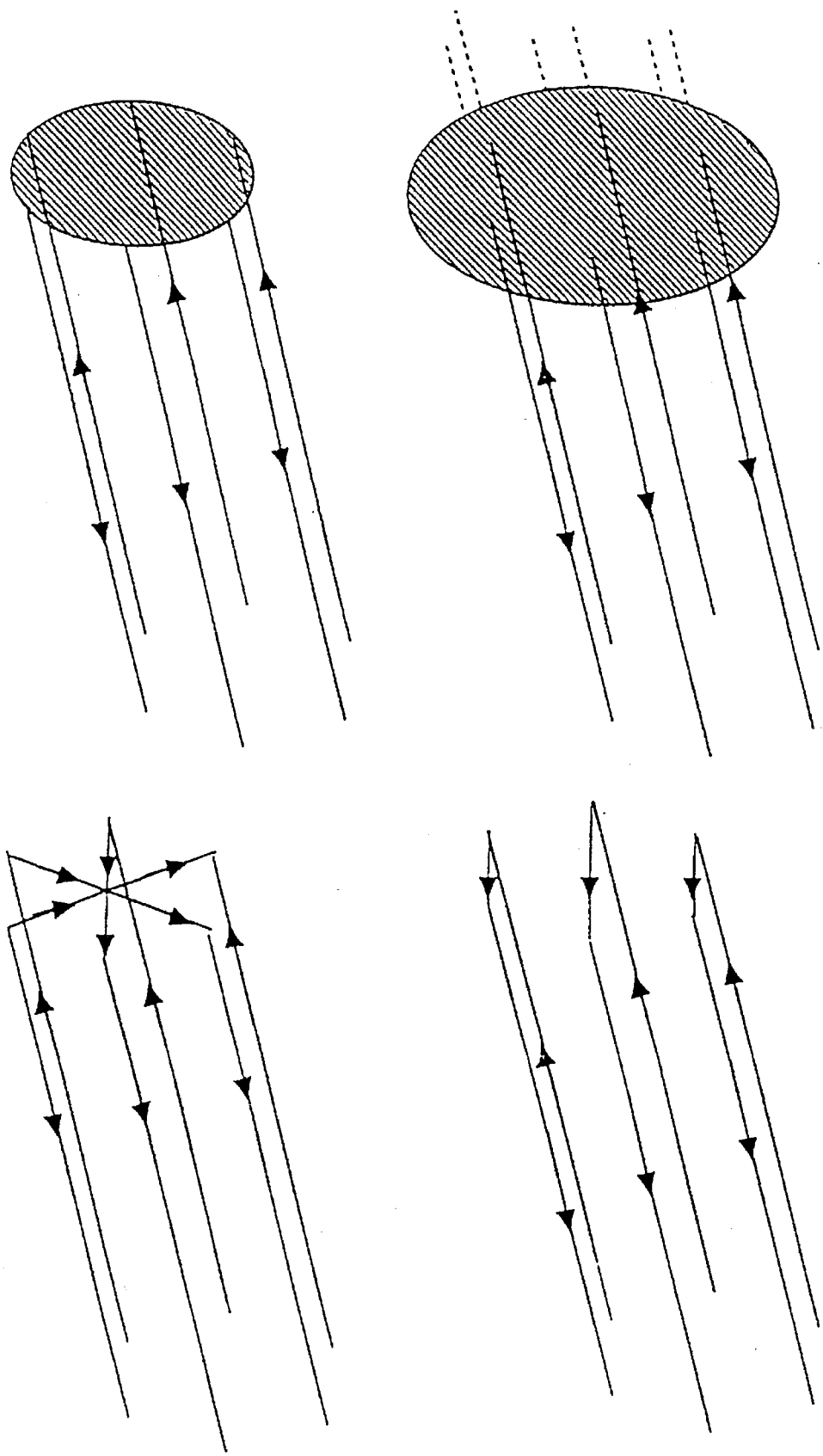
FIG. 18 illustrates an embodiment of the present invention wherein the current paths at the ends of the wire loops are closed.

The wire loops may be closed at the ends in a variety of ways, as in FIG. 18. Those configurations in which the wires terminate in a plate require some individual current adjustment to compensate for resistance differences of different paths. The drawing in the lower right shows the wires terminating in a plate that is considerably larger than the wire circle. In a pulsed system, in which the pulse rate or frequency is sufficiently high that the skin depth in the plate is less than its thickness, there will be image currents in the plate that will produce a field structure that will reduce the end effects of the finite length of the system.

Figure 19:
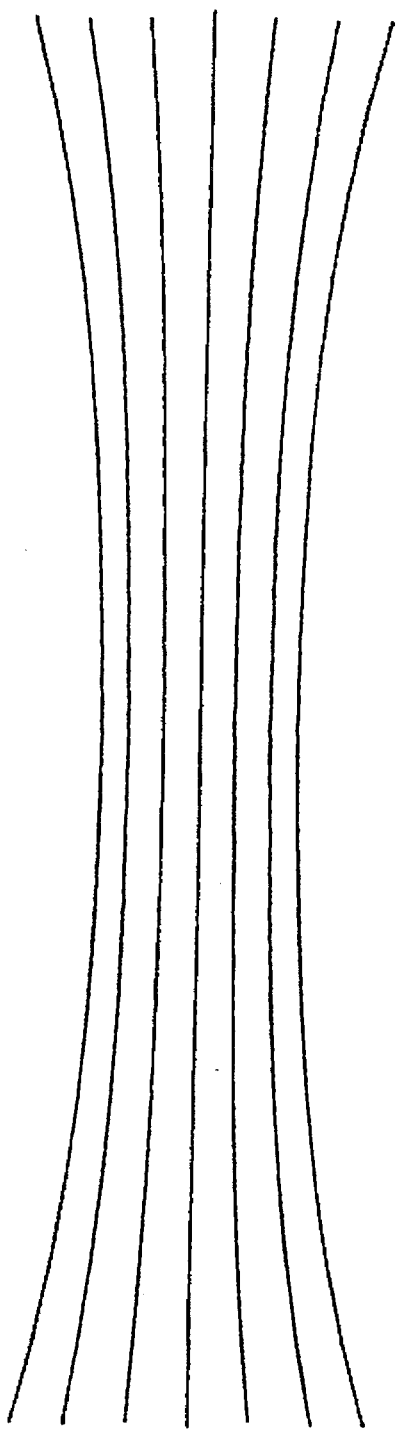
FIG. 19 illustrates an embodiment of the present invention wherein the wire loops are biconic to compensate for increased field in approaching the ends of the magnet.

Considering just the rectangular loop case, although all configurations will show effects of finite length (end effects), a simple calculation shows that the field increases in moving from the center of the system toward either end, in a manner analogous to that of solenoids, whose fields decrease in approaching the ends. The functional dependence near the center of a solenoid is very nearly the inverse of that of a comparable length transverse field system. Compensation for end effects in a solenoid is made using shim coils to increase the fields at the ends. In the transverse field system of rectangular loops of the invention, compensation may be made by, e.g., increasing the system radius as some function of the distance from the system center as the ends are approached, making the configuration approximately biconic (see FIG. 19). The rate of radius increase must be calculated. End effects on the useful area near the center can also be decreased by making the system longer with respect to its radius, just as with a solenoid.

The transverse field system of the invention can be either superconducting or resistive. Superconducting systems have the advantages of current stability and essentially no power to maintain the field after the current is brought to final value. This means that superconducting systems can generally be operated at much higher fields than resistive systems, where power requirements and heat dissipation become prohibitive. Superconductive systems have the major disadvantages of complexity, high operating costs for the cryogenic systems, danger of failure (quench), need to operate continuously (long time to power up and down), and high initial cost.

To be used in cryogenic modes, the transverse field system of the present invention requires configurations where mechanical forces can be conveniently transferred through vacuum walls, so that individual wires (or conducting paths) can be cooled to cryogenic temperatures. For example, the wires may be supported by a more or less solid cylinder and the cooling methods similar to those for solenoids applied. Cryogenic is not necessarily superconducting. Cooling the conductors to liquid nitrogen temperatures (77 K) reduces copper resistance by a factor of 7, reducing power dissipation (and voltage requirements) by a factor of 7 for a given field. This may not require vacuum thermal insulation, although such insulation is usual in liquid nitrogen systems.

High fields are achievable in a resistive version of the transverse field system of the invention by operation in a pulsed mode, that is, at low duty cycle. The specific heat of the copper windings and supports absorb the heat from the short high-power pulse, and the heat is dissipated or carried away with moderate cooling rates. This is possible with the transverse field system because of its low inductance (a few to tens of millihenries vs. many henries for a large solenoid).

Pulsers for the system may be any of a variety of types. In general, a principal advantage of a pulsed system is that energy can be stored locally over a time long compared to the pulse length, then can be switched into the low-duty-cycle magnet. This minimizes the requirements for high wall-plug power. Pulse lengths will depend on the state of the art of imagers and the specific application. FDA limits rates of change of magnetic fields on patients to 2 T/s. Currents that have on-times of a few seconds may be best supplied by rotating machinery such as homopolar generators or storage systems such as rechargeable batteries. Short pulses may be supplied by capacitor banks.

Figure 20:
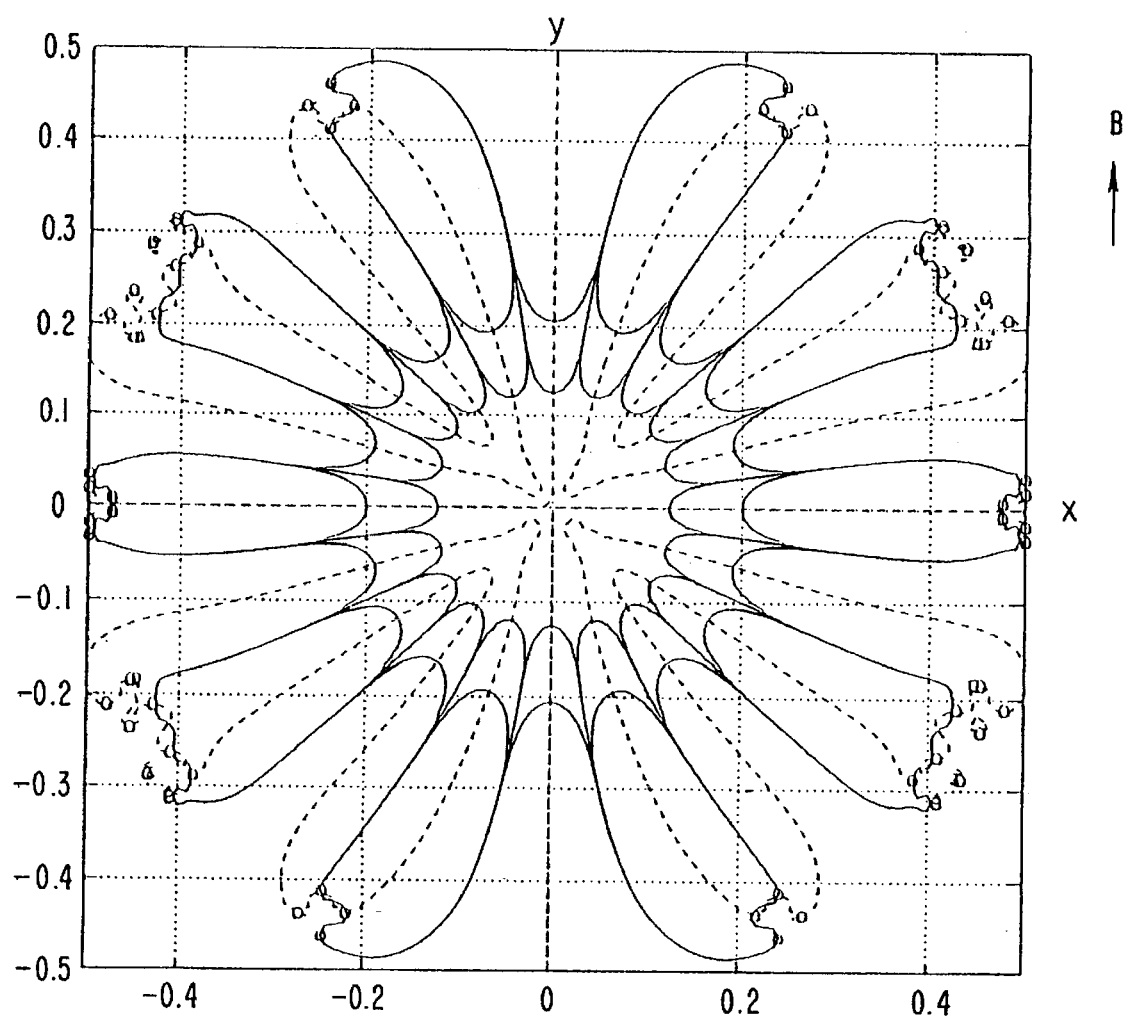
FIG. 20 shows the 16-wire optimum case of FIG. 8 with each wire separated into four wires grouped around the original wire positions, showing negligible perturbation of the 1 PPM contour (the two contours are 1 PPM and 100 PPM)

The calculation of the fields generated by the various embodiments of the present invention was done assuming perfectly located wires and filamentary currents. An examination of the effect of finite wire size was made by doing calculations in which each wire was split into four wires clustered about the location of the original single wire, with the wires each being displaced by the same distance in the x and y coordinates. The field was then calculated. The result was a very small effect on the accuracy of the field for reasonable displacements. An example is shown in FIG. 20, where each of the four wires in a set were separated into groups with diameters of 10% of the system radius. The By fractional error contours are at 1 PPM and 100 PPM. Comparison of the 1 PPM contour with the same contour in the unperturbed case of FIG. 8 shows negligible perturbation of the 1 PPM contour by the simulated large finite-size wire. Splitting the conducting paths into several is useful in configurations where two wires in a set are very close together, such that it is impossible to locate wires of the needed wire diameter (for sufficient current capacity) at their proper locations. The wires may be split into a sets of four or more, grouped around the proper centroid, an leaving room inside the group for the other wire or wires.

A computer routine may be written that introduces a random error in the simulated location of each filamentary current in a wire set, so the effect of manufacturing inaccuracies can be evaluated. To a first approximation, one would expect that it would be necessary to locate the wires to an accuracy of 10 parts per million to achieve a field accuracy of 10 PPM. However, if the wire errors are random, the randomness aids by averaging out errors. In the 16-wire case, a wire location accuracy of about 100 PPM was needed for 20 PPM field uniformity in the useful center region. This is about 2 thousandth of an inch in a full body scale MRI without trimming coils. This is a reasonable level of accuracy. Wire location errors that are systematic and not random may introduce no field uniformity errors. For example, if the wire angles are correct, but the radius is incorrect, the field magnitude will change, but the uniformity will not be affected. If the wire angles are all shifted by the same rotation, the field will be rotated, but the uniformity will be unaffected.

A wire may also be split into a plurality of wires at low current surrounding a central wire carrying the primary current. By adjusting the currents in the surrounding wires, a device according to the present invention may be tuned. Depending on the magnitudes of the small surrounding currents, the centroid of the field produced by the wire set is altered. By manipulating the currents, the apparent location of the wire is modified.

The preferred embodiment described above is a dipole magnet. It preferably has wires in each quadrant located at exactly the same angles as those in all other quadrants. The system is therefore mirror-symmetric about both the x and y axes, but the currents in the wires at negative x have the opposite sense as those with positive x. This produces a B field in the y direction having very high uniformity.

Figure 21:
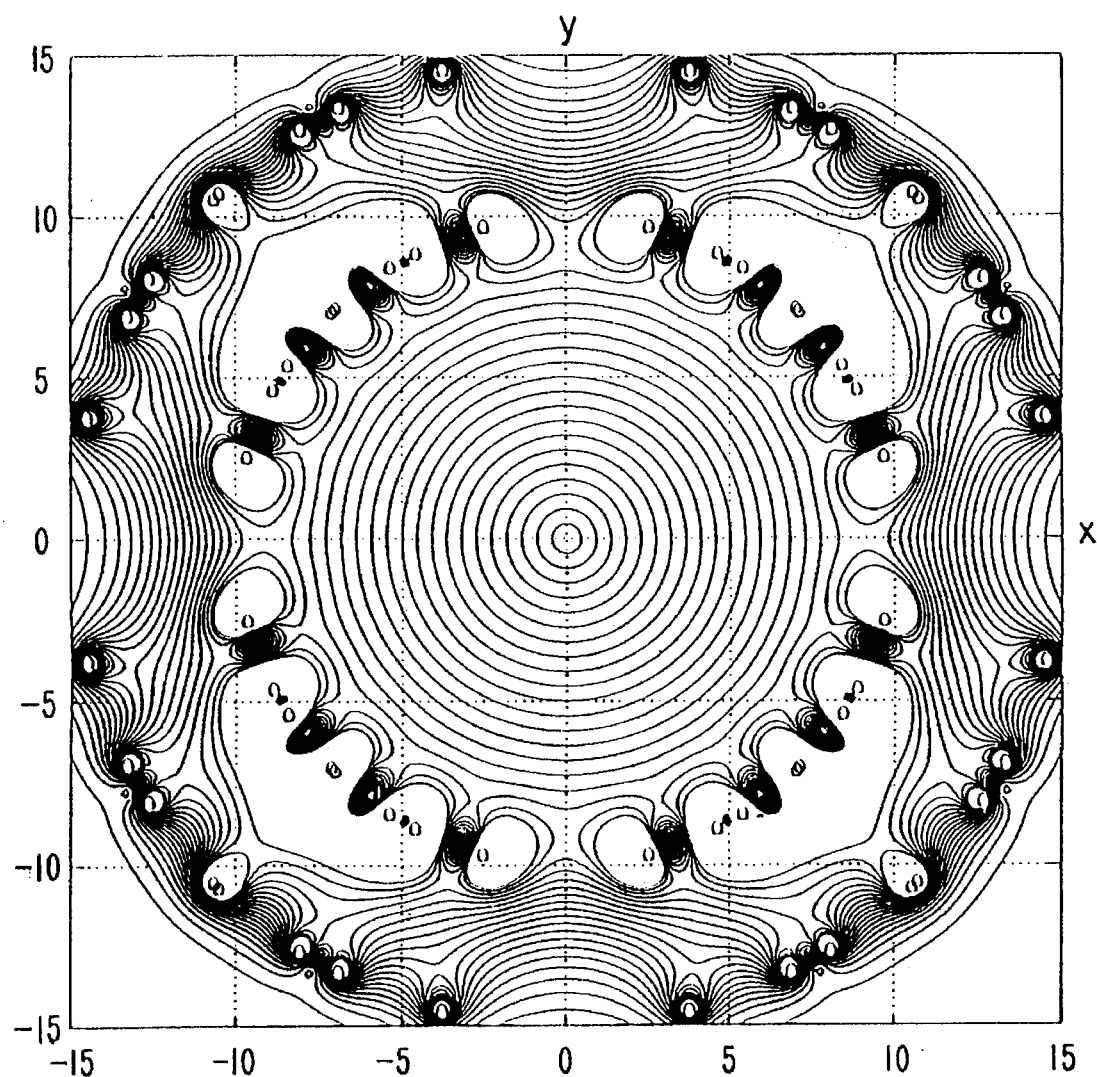
FIG. 21 shows the contours of constant B magnitude (not field lines) generated by a 32-wire quadrupole embodiment of the present invention with field cancellation coils (the uniform spacing of circular contours in the interior demonstrates the constant radial gradient)

The present invention is also of a quadrupole magnet for generating a large volume of very high uniformity of the gradient of B. That is, the increase of the magnitude of the magnetic field with increasing radius (distance from the center of the wire circle) is highly linear. In a perfect quadrupole, the increase in field magnitude with radius is perfectly linear. The optimum quadrupole configurations are derived most easily from the optimum dipole (uniform field) configuration angles by dividing the angles of all wires with positive current (in the x>0 semicircle, or + and −90°) by two and reproducing this new set (which now occupies 90° instead of 180°) in each quadrant with reversal of current in adjacent quadrants. For example, one simple optimum dipole set has wires at [−48, −12, 12, 48] degrees. The associated optimum quadrupole will have wires at [−24, −6, 6, 24] degrees with positive current, wires at 90+[−24, −6, 6, 24]=[66, 84, 96, 114] degrees with negative current, and so on, around the circle. This method also applies to the wire-on-axis dipole sets. The wire location angles are mirror-symmetric every 45°, but the current direction change is every 90°. In the dipole embodiment, wire symmetry is every 90°, with current reversal every 180°. FIG. 21 shows the contours of constant B magnitude (not field lines) generated by a 32-wire quadrupole. The uniform spacing of circular contours in the interior demonstrates the constant radial gradient. The figure also shows the field cancellation coils that may be applied to the quadrupole system.

Referring to FIG. 21, external field cancellation in the quadrupole embodiment operates in a manner similar to that preferred for the dipole embodiment. An outer set of wires (preferably loops) are placed at the same angular locations as the main (inner) set, and an opposite current applied (i.e., the current in each wire in the field-cancellation set is opposite in sense to the wire at the same azimuthal position in the main set). The magnitude of the current in each wire is the current in the main set times the square of the ratio of the inner and outer set radii. Therefore, if there is 1 kA in each wire in the inner set which is at a radius of 1, the current in each wire of the field cancellation set at a radius of 2 will be 250 kA. This is similar to the dipole embodiment except that in that case it is the ratio of the radii, and here the square of the ratio of the radii. The field falls off even more rapidly than in the dipole case for any given number of wires, which is understandable because the primary field in the quadrupole begins at a higher order.

The present invention is also of sextupole and higher magnetic and electric multipoles. The optimum sextupole versions are derived from the optimum dipole configurations in a manner similar to that of the quadrupole sets, but the dipole angles are divided by 3 instead of 2, and duplicated every 60° with current reversal, instead of each 90°. Similarly, the optimum octupole versions have the optimum dipole wire angles divided by 4, with current reversal each 45°, etc. In the sextupole magnet, the radial gradient (first derivative with respect to the radius) of the field magnitude is ideally constant. In a quadrupole magnet, the first derivative of the field magnitude with respect to radius (the radial gradient) is ideally constant. In the sextupole magnet, the second radial derivative of the field magnitude is ideally constant. In the octupole magnet, the third radial derivative of the field magnitude is ideally contant, and so on for higher orders. In the sextupole configurations of the present invention, large fractions of the cross-sectional area contained within the wire circle have highly uniform second radial derivatives of the field magnitude. Similarly, in the octupole configurations of the present invention, large fractions of the cross-sectional area contained within the wire circle have highly uniform third radial derivatives of the field magnitude, and so on for higher order magnets.

The external field cancellation method described above for the dipole and quadrupole systems also applies to the sextupole configuration, with the current in the field cancellation conductors being proportional to the cube of the ratio of the radii of the main field and field cancellation conductor circles. In the octupole configuration, the current in the field cancellation conductors is proportional to the fourth power of the inner and outer wire circle radii, and so on with higher multipoles. As with the quadrupole, the field cancellation is increasingly effective with higher order multipoles.

The magnetic quadrupole and sextupole embodiments of the invention are useful in focusing systems for charged particle beams. An ideal quadrupole field has the x component of B equal to some constant k times y (the local y coordinate, so $B_x=ky$), and $B_y=kx$, and the ideal sextupole has $B_x=ky^2$, and $B_y=kx^2$, and so on for higher multipoles. The quadrupole and higher multipole systems of the present invention come quite close to this ideal over a large fraction of the core region, and so are an efficient beam focuser. The useful cross-sectional area of the present invention is a much larger fraction of the total device area than is the case for existing multipole magnets. The open geometry offers advantages over the most commonly used iron core magnets in access for beam diagnostics. The low inductance allows high-speed pulsing to high fields and gradients for pulsed beam applications. For systems not requiring open access, the present invention in quadrupole and higher multipole forms can be surrounded by a ferromagnetic shield without degrading the field characteristics, just as in the dipole case. The invention in its electric quadrupole form is also useful for focusing charged particle beams in a fashion exactly analogous to the magnetic quadrupole version.

The concept of the invention of duplicating the dipole system, turning the duplicate conductive pathway set 90° about the long axis of the system, combining it with the original set and driving the first and second sets with currents in quadrature (sine and cosine time dependence) to produce a rotating field system can be extended to the quadrupole and higher multipole versions. In the quadrupole versions the system is duplicated and the duplicate rotated only 45°, and the two parts are driven in quadrature to produce a field configuration that rotates in time. The field configurations rotates at half the rate of the dipole rotating field system if driven with currents of the same frequency as the dipole system, while maintaining the uniformity of the radial gradient of the field magnitude. Similarly, the sextupole system can be duplicated, turned 30°, and fed with quadrature currents to produce a system whose magnetic field configuration rotates about the origin at a rate one-third that of the dipole rotation rate.

Quadrupole magnets are generally used in pairs for focusing charged particle beams. In passing through a quadrupole magnet along the magnet axis, a charged particle beam sees a focusing force in two opposite quadrants (e.g. quadrants 1 and 3), and a weaker defocusing force in the other two quadrants. If the beam is then passed through a second quadrupole magnet that is rotated 90° to the first, the parts of the beam that were defocused are now focused, and the parts that were focused are somewhat defocused. The net result is overall focusing. If the quadrupole field is rotated at a rate that is fast compared to a beam transit time through the magnet, the net effect is focusing in a single magnet, instead of the two or more now needed.

Another application of the quadrupole invention in both its electric and magnetic forms is separation of components of fluids. An electric dipole consists of two equal-magnitude charges of opposite sign separated by a small distance. The electric dipole moment is defined as the charge separation distance times the magnitude of one of the charges. An electric dipole in a constant electric field does not feel any net force, because both the positive and negative charges feel the same force, but in opposite directions. The dipole does feel a torque, however, that tends to align the dipole with the electric field. If there are no competing effects, a very small field will align a dipole with the field. If there are thermal effects, the aligning electric field competes with the randomizing effect of the thermal collisions, and then stronger electric fields result in a stronger (average) dipole alignment with the applied electric field.

If the electric field has a gradient, for example becomes weaker farther from a source or charge, then there is a translational force on a dipole in the field since the end of the dipole in the weaker field sees less force than the end in the stronger field. This applies to the extent that the dipole is aligned with the electric field. If the randomizing effects of thermal collisions are much stronger than the effect of the field in aligning the dipole, the average force will be near zero. The net result is that the net time-average force tending to move a dipole in a real (at some temperature) medium is a function of the applied field strength as well as the applied field gradient.

All the above arguments apply equally well to magnetic fields and dipoles. A magnetic dipole can be thought of as a small current loop, or conceptually as two small magnetic charges separated by a small distance, with all the above discussion applying. The magnetic charges, unlike electric charges, are purely conceptual, since no magnetic monopole has been isolated.

Dipoles can be induced or permanent. An example of a permanent magnetic dipole is a bar magnet or bit of magnetized iron. Any ferromagnetic material (iron, nickel, and others) in a magnetic field responds by developing an induced dipole moment, and it is this dipole that is attracted to the source of the field, which, again, must have a gradient for any net force to be produced.

A dielectric (nonconductor) placed in an electric field develops dipole moments that reduce the electric field in the material from that existing outside. The stronger this effect (stronger induced dipoles), the higher the dielectric constant of the material. If an isolated conductor is placed in an electric field, free charges will move in the conductor in such a way as to cancel the electric field in the conductor; this results in an induced dipole on the conductor. If the electric field has a gradient, the dielectric and the conductor will feel a net torque tending to align the dipole with the field and a net force in the direction of the gradient. If the dipole is perfectly aligned with the field, the net force on the dipole depends only on the strength of the gradient, not on the magnitude of the field. This is true even if the direction of the field and the direction of the gradient of the field are not the same.

The quadrupole versions of the present invention can use this effect to separate components of fluids or gases. For example, water has a dielectric constant of about 80, and oil about 3. A much larger dipole will be induced in a droplet of water than one of oil. If a small amount of water is dispersed in oil and an electric field gradient applied, the water will move in the direction of the gradient. This can be used to separate water from oil (or other liquids, such as gasoline; water in gasoline is a serious contaminant). How rapidly the water droplet moves in the oil is a function of the size of the droplet (larger is larger force), oil viscosity, Reynolds number, electric field strength (for induced dipoles) and strength of the field gradient.

Note that the electric quadrupole uses a very small amount of power since there is essentially no current flow.

There must be some energy transfer to the medium since the entropy of the mixture is decreased by this process. A permanent-magnet quadrupole would also be feasible, but would have to be periodically cleaned, since the ferromagnetic contamination would not settle out.

Figure 22:
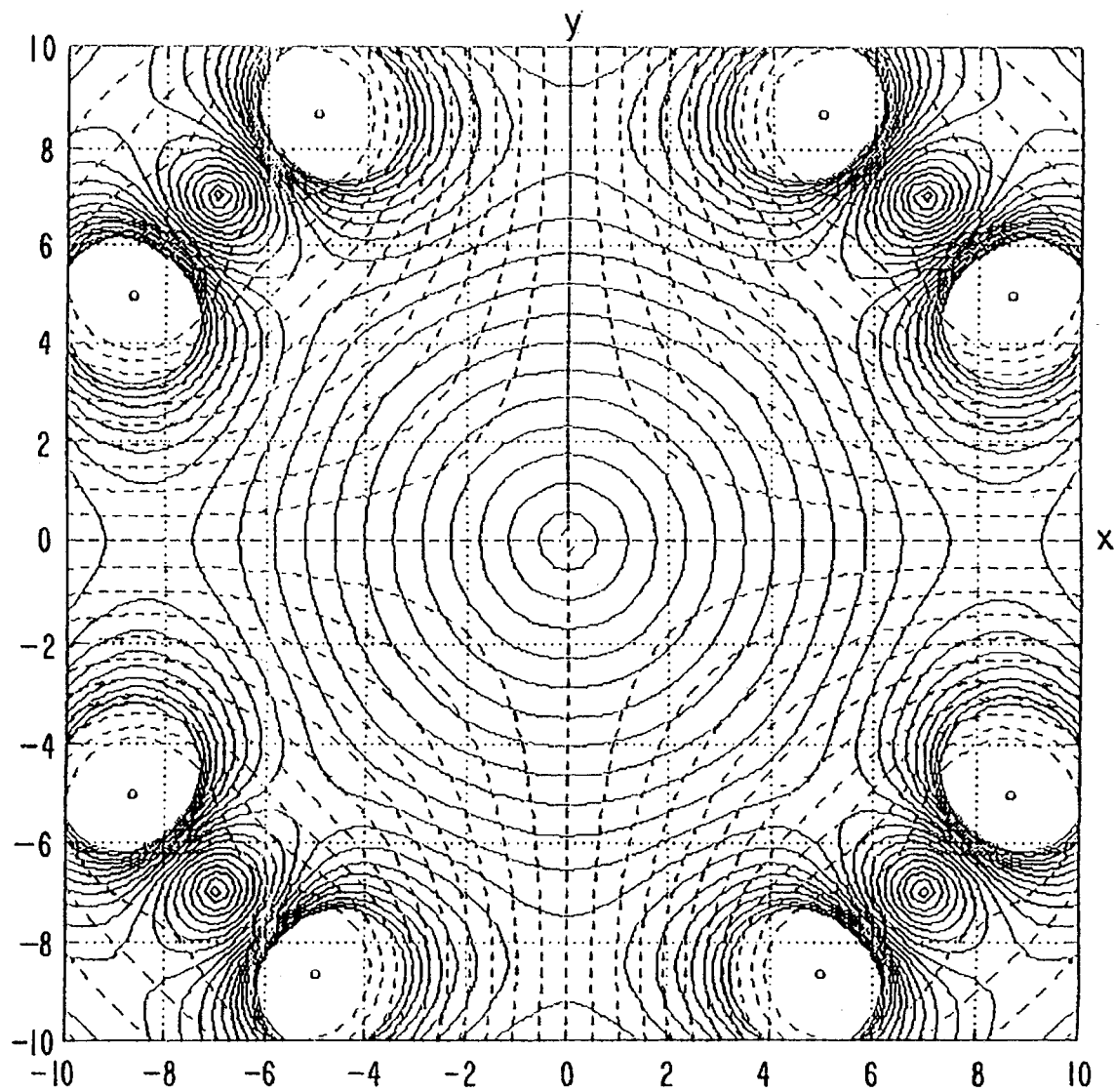
FIG. 22 shows, in the embodiment of FIG. 21, the contours of constant magnitude of B (solid lines) indicating that the gradient is radially outward (field is zero at the center), and B-field lines (dashed lines) showing that, in general, the gradient is not parallel to the field lines in the present invention.
Figure 23:
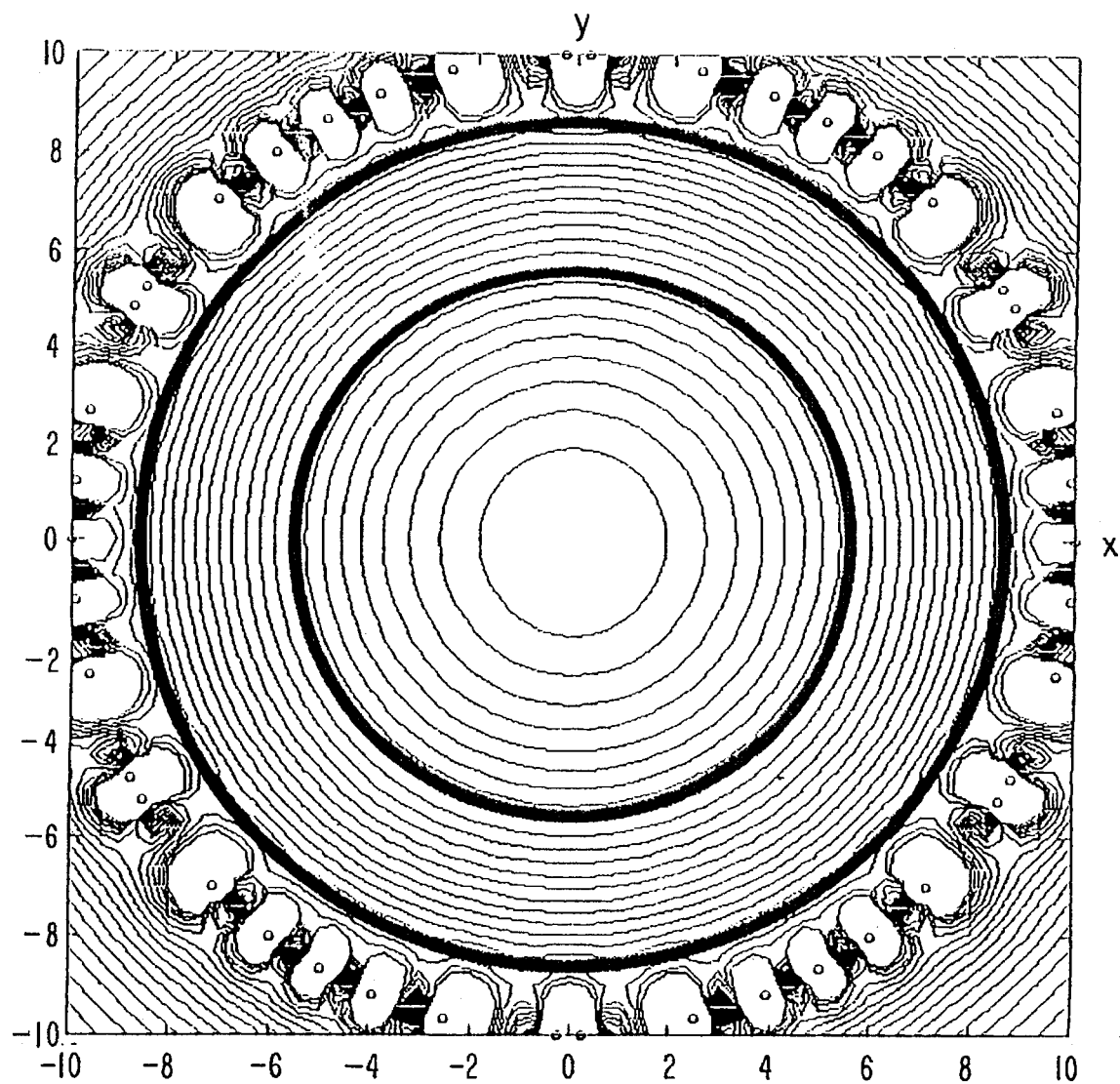
FIG. 23 shows a double cylinder (dark shaded circles) used to confine fluid to be separated to the high field, high gradient, large radii regions of the separator applications of the present invention (embodiment shown is a 42-wire optimum sextupole).

Note that many of the applications of the invention stress the production of highly uniform fields and gradients. These separation processes do not require high uniformity. In fact, another way to produce a large electric field gradient is with a single wire surrounded by a coaxial conducting cylinder, in the same configuration as the coaxial cable used for radio and television, but, of course, with open space between the conductors. This coaxial system produces a very high field and gradient near the wire, but the field and gradient fall off rapidly with radius so the useful area of high gradient is small. In the single-wire-coaxial configuration, the field and gradient are parallel, with the gradient radially inward. Another configuration that would produce large local gradients (near the wires) is a matrix (square, hexagonal, or some other pattern) of parallel fine wires with opposite potentials applied to nearest-neighbor wires. Again, the high fields and gradients are in a relatively small volume near the wires. The present invention in its quadrupole configurations produces a uniform gradient throughout the cylindrical volume, with a field that is zero on the long axis (coordinate origin in the cross-section), whose gradient is radially outward, with uniformity dependent on radius and the number of wires employed in the system. The field is not generally parallel to the gradient as shown in FIG. 22 with contours of constant magnitude of B delineated by solid lines, and B-field lines by dashed lines. The field is zero at the origin, and the evenly spaced circles of magnitude of B about the origin show that the gradient of B is uniform and radially outward over a large fraction of the area, even in this simple 8-wire quadrupole illustration (compare with FIG. 21). The present invention has more useful volume in the same size system than single-wire-coaxial or wire matrix systems. The higher order multipoles (sextupoles and above) concentrate the field and gradients even more toward the larger radius, larger area regions of the system. In a fluid or gas separation application, the effectiveness of the system would be enhanced in the present invention by directing the fluid to these outer radius regions by using a double cylinder that excludes fluid from the small radius regions as illustrated in FIG. 23, which shows a 42-wire sextupole (wires indicated by small circles) with lines of B-magnitude plotted. The two thin-wall cylinders, shown shaded, would restrict flow to the high field, high gradient region between them.

The effect is not restricted to liquids, but could also be used in gas streams, as electrostatic scrubbers are used now. These presently used devices remove particles in the gas stream with electric fields applied to induced static charges on the contaminants, but do not depend on a gradient-dipole process.

Electric gradients produce pressures in dielectric fluids. This is useful in the separation process to move components around. Electrostatic pumps may be based on this principle. There are also forces on liquid drops in air (or in other gases), which is useful for dehumidification.

The invention may also be applied on a molecular level, because water, for example, is a highly polar molecule. This provides a way to separate water and alcohol, having application in both synthetic fuel and liquor industries. However, the force on a dipole depends on its dipole moment, which is small for individual molecules. If the energy associated with the dipole in the field is much less than the thermal energy of the molecule, there will be little motion of the molecule in the direction of the field gradient. Methods for applying large fields and gradients, preferably pulsed to minimize electrical breakdown, must be employed.

Industrial Applicability:

The various embodiments of the invention have utilities including the following:

Uniform constant dipole magnetic field:
  Magnetic Resonance Imaging (MRI) for:
  Medical applications
  Imaging of industrial solids, liquids and sheets
  Imaging of flows of fluids, slurries, mixtures, and powders
  Magnetic resonance microscopy
  Nuclear Magnetic Resonance (NMR) spectroscopy
  Charged particle beam steering and guiding
  Charged particle momentum analyzers
  Atomic clocks
  Isotope separators
Uniform pulsed dipole magnetic field:
  Pulsed MRI for medical or industrial imaging
  High-field pulsed-beam charged particle momentum analyzer
Rotating dipole magnetic field:
  Rotating field for NMR spectroscopy, including with solenoid
  Time-resolved charged-particle momentum analyzer
Quadrupole, sextupole, and higher multipole magnetic field:
  Focusing magnet for charged particle beams
  Separator for removing ferromagnetic materials from fluids
Rotating quadrupole and higher multipole magnetic field:
  Compact focusing devices for charged particle beams
Uniform dipole electric field:
  Charged particle beam guiding, e.g., electrons in image tubes
  Charged particle energy analyzers
Quadrupole, sextupole, and higher multipole electric field
  Focusing devices for charged particle beams
  Separators for liquids with different dielectric properties
  Separators for removing particles from fluids The invention is further illustrated by the following nonlimiting examples.

EXAMPLE 1

A working model of the 16-wire uniform magnetic field system shown in cross-section in FIG. 7 was built, having a primary-wire cylinder radius of 5 cm, with the 8 primary loop coils made of 7 turns each of #17 Formvar-insulated magnet wire, and the 8 field-cancellation coils made of 4 turns of the same wire. All coils were operated in series, with sets of measurements made with and without current in the field cancellation coils. The relationship between applied current and the measured field in the core region inside the primary coils was that calculated within the accuracy of the current and field measurements possible at the low fields (1 mT) produced by the low current capacity of the wire used. The field variation along a radius was also that calculated, within measurement accuracy and resolution. With the use of the field cancellation coils, the field outside the system fell so rapidly to the 0.05 mT background that a rate of decrease with radius could not be determined.

EXAMPLE 2

A working model of the electric gradient separator embodiment of the invention was also built. Two glass 50 cc graduated cylinders were each filled with a mixture of clear vegetable oil (canola oil) mixed with 10% deionized water in a blender to a milky appearance. A simple four-conductor quadrupole field was generated by about 6 kV applied to four strips of 5 mm wide copper tape glued vertically and evenly spaced around on one of the cylinders. After about one hour, more than half the water had separated from the oil with the field applied, and had collected in the bottom of the cylinder. The water is not miscible with oil, and the drops tend to combine when brought together. Water is denser than the oil, and when the drops become large enough (drag and thermal mixing effects become small relative to mass and gravity), the drops sink. Other relatively large droplets (visually enough to account for the other half of the water) had collected on the sides of the cylinder, but had not coalesced and sunk to the bottom. The oil was clear enough to see through. The oil/water mixture in the cylinder without the field applied was visually unchanged, with no visible water in the bottom and retaining the original milky translucent appearance. The separation rate verified a rough calculation of the forces and velocities to be expected with small spheres of water in viscous oil at low Reynolds numbers.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, patents, and publications cited above are hereby incorporated by reference.

What is claimed is:

1. An apparatus for generating an electromagnetic field having a region of homogeneity of a characteristic of said electromagnetic field, said apparatus comprising:

a central axis of said apparatus; and at least a minimum number of conductive pathways disposed about and substantially parallel to said central axis, azimuthal locations of said conductive pathways being substantially defined by locations selected from the group consisting of an x-axis, solutions to $$\cos(3\phi_n) + \cos(3\phi_{n-1}) + \ldots + \cos(3\phi_1) + w = 0,$$

said solutions divided by a positive integer, and said solutions divided by a positive integer reflected about a plane of reflection, where n is a number of conductive pathways per quadrant and w is selected from the group consisting of 0 and 0.5;

wherein said characteristic comprises a characteristic selected from the group consisting of rate of rotation, field magnitude, radial gradient, and higher order radial derivatives of field magnitude and said minimum number of conductive pathways is 18 where said characteristic comprises radial gradient and is 10 otherwise.

2. The apparatus of claim 1 wherein azimuthal locations of said conductive pathways are substantially defined by locations selected from the group consisting of an x-axis, solutions to a set of equations comprising one or more of the group consisting of $$\cos[(2n + 1)\phi_n] + \cos[(2n + 1)\phi_{n-1}] + \ldots + \cos[(2n + 1)\phi_1] + w = 0$$
$$\cos[(2n - 1)\phi_n] + \cos[(2n - 1)\phi_{n-1}] + \ldots + \cos[(2n - 1)\phi_1] + w = 0$$
$$\cos[(2n - 3)\phi_n] + \cos[(2n - 3)\phi_{n-1}] + \ldots + \cos[(2n - 3)\phi_1] + w = 0$$
$$\vdots$$
$$\cos(5\phi_n) + \cos(5\phi_{n-1}) + \ldots + \cos(5\phi_1) + w = 0 \text{ and}$$
$$\cos(3\phi_n) + \cos(3\phi_{n-1}) + \ldots + \cos(3\phi_1) + w = 0,$$

said solutions divided by a positive integer, and said solutions divided by a positive integer reflected about a plane of reflection, where n is a number of conductive pathways per quadrant and w is selected from the group consisting of 0 and 0.5.

3. The apparatus of claim 1 wherein said conductive pathways define an approximately biconic volume having a long axis parallel to said central axis.

4. The apparatus of claim 1 wherein said electromagnetic field comprises a magnetic field.

5. The apparatus of claim 4 wherein each of said conductive pathways comprises a substantially identical line current magnitude.

6. The apparatus of claim 4 wherein not all conductive pathways comprise a substantially identical line current magnitude, thereby producing a transverse gradient in said magnetic field.

7. The apparatus of claim 6 wherein said central axis is curved.

8. The apparatus of claim 1 wherein said electromagnetic field comprises an electric field.

9. The apparatus of claim 8 wherein each of said conductive pathways comprises a substantially identical line charge.

10. The apparatus of claim 8 wherein not all conductive pathways comprise a substantially identical line charge, thereby producing a transverse gradient in said electric field.

11. The apparatus of claim 10 wherein said central axis is curved.

12. The apparatus of claim 1 additionally comprising means for substantially canceling said electromagnetic field external to said apparatus, said means for substantially canceling comprising a plurality of conductive lines equal in number to said conductive pathways.

13. The apparatus of claim 12 wherein said conductive lines are located at the same azimuthal positions as said conductive pathways.

14. The apparatus of claim 1 additionally comprising means for pulsing current through said conductive pathways.

15. The apparatus of claim 14 wherein said means for pulsing current comprises means selected from the group consisting of homopolar generators, rotating flywheel energy storage systems, capacitive electrical storage and discharge systems, and high-current power supplies operating directly from electrical mains.

16. The apparatus of claim 1 wherein said conductive pathways comprise clusters of wires.

17. The apparatus of claim 16 wherein each of said clusters of wires comprises a plurality of wires disposed around a central wire.

$$\cos[(2n + 1)\phi_n] + \cos[(2n + 1)\phi_{n-1}] + \ldots + \cos[(2n + 1)\phi_1] + w = 0$$
$$\cos[(2n - 1)\phi_n] + \cos[(2n - 1)\phi_{n-1}] + \ldots + \cos[(2n - 1)\phi_1] + w = 0$$
$$\cos[(2n - 3)\phi_n] + \cos[(2n - 3)\phi_{n-1}] + \ldots + \cos[(2n - 3)\phi_1] + w = 0$$
$$\vdots$$
$$\cos(5\phi_n) + \cos(5\phi_{n-1}) + \ldots + \cos(5\phi_1) + w = 0 \text{ and}$$
$$\cos(3\phi_n) + \cos(3\phi_{n-1}) + \ldots + \cos(3\phi_1) + w = 0,$$

18. The apparatus of claim 17 additionally comprising means for adjusting current in said plurality of wires so as to tune a field centroid of said cluster of wires.

19. The apparatus of claim 1 wherein said conductive pathways comprise current sheets.

20. The apparatus of claim 1 additionally comprising an electromagnetic shield surrounding said conductive pathways.

21. The apparatus of claim 1 wherein pairs of conductive pathways of opposite charge are joined at an end of said apparatus by a member selected from the group consisting of loops of conductive material, current sheets, and conductive plates.

22. The apparatus of claim 1 wherein said apparatus comprises a device selected from the group consisting of magnetic resonance imager, pulsed magnetic resonance imager, magnetic resonance microscope, nuclear magnetic resonance spectroscope, charged particle beam steerer, charged particle momentum analyzer, high-field pulsed-beam charged particle momentum analyzer, time-resolved charged-particle momentum analyzer, atomic clock, isotope separator, charged particle beam focuser, separator for removing ferromagnetic material from fluids, charged particle beam guider, charged particle energy analyzer, separator of fluids having different dielectric properties, and separator of particles from fluids.

23. A method for generating an electromagnetic field having a region of homogeneity of a characteristic of the electromagnetic field, the method comprising the steps of:
 a) establishing a central axis;
 b) situating at least a minimum number of conductive pathways, disposed about and substantially parallel to the central axis, at azimuthal locations substantially defined by locations selected from the group consisting of an x-axis, solutions to $$\cos(3\phi_n) + \cos(3\phi_{n-1}) + \ldots + \cos(3\phi_1) + w = 0,$$

the solutions divided by a positive integer, and the solutions divided by a positive integer reflected about a plane of reflection, where n is a number of conductive pathways per quadrant and w is selected from the group consisting of 0 and 0.5; and
 c) generating the electromagnetic field comprising a region of homogeneity of a characteristic selected from the group consisting of rate of rotation, field magnitude, radial gradient, and higher order radial derivatives of field magnitude, and said minimum number of conductive pathways is 18 where said characteristic comprises radial gradient and is 10 otherwise.

24. The method of claim 23 wherein the situating step comprises situating the conductive pathways at azimuthal locations substantially defined by locations selected from the group consisting of an x-axis, solutions to a set of equations comprising one or more of the group consisting of $$\cos[(2n + 1)\phi_n] + \cos[(2n + 1)\phi_{n-1}] + \ldots + \cos[(2n + 1)\phi_1] + w = 0$$
$$\cos[(2n - 1)\phi_n] + \cos[(2n - 1)\phi_{n-1}] + \ldots + \cos[(2n - 1)\phi_1] + w = 0$$
$$\cos[(2n - 3)\phi_n] + \cos[(2n - 3)\phi_{n-1}] + \ldots + \cos[(2n - 3)\phi_1] + w = 0$$
$$\vdots$$
$$\cos(5\phi_n) + \cos(5\phi_{n-1}) + \ldots + \cos(5\phi_1) + w = 0 \text{ and}$$
$$\cos(3\phi_n) + \cos(3\phi_{n-1}) + \ldots + \cos(3\phi_1) + w = 0,$$

the solutions divided by a positive integer, and the solutions divided by a positive integer reflected about a plane of reflection, where n is a number of conductive pathways per quadrant and w is selected from the group consisting of 0 and 0.5.

25. The method of claim 23 wherein the situating step comprises situating conductive pathways defining an approximately biconic volume having a long axis parallel to the central axis.

26. The method of claim 23 wherein the generating step comprises generating a magnetic field.

27. The method of claim 26 wherein the generating step comprises passing through each of the conductive pathways a substantially identical line current magnitude.

28. The method of claim 26 wherein the generating step comprises passing through fewer than all conductive pathways a substantially identical line current magnitude, thereby producing a transverse gradient in the magnetic field.

29. The method of claim 28 wherein the establishing step comprises establishing a curved central axis.

30. The method of claim 23 wherein the generating step comprises generating an electric field.

31. The method of claim 30 wherein the generating step comprises placing on each of the conductive pathways a substantially identical line charge.

32. The method of claim 30 wherein the generating step comprises placing on fewer than all conductive pathways a substantially identical line charge, thereby producing a transverse gradient in the electric field.

33. The method of claim 32 wherein the establishing step comprises establishing a curved central axis.

34. The method of claim 23 additionally comprising the step of substantially canceling the electromagnetic field external to a volume, by providing a plurality of conductive lines defining the volume and equal in number to the conductive pathways.

35. The method of claim 34 wherein the step of substantially canceling comprises situating conductive lines located at the same azimuthal positions as the conductive pathways.

36. The method of claim 23 wherein the generating step comprises pulsing current through the conductive pathways.

37. The method of claim 36 wherein the pulsing step comprises utilizing a member selected from the group consisting of homopolar generators, rotating flywheel energy storage systems, capacitive electrical storage and discharge systems, and high-current power supplies operating directly from electrical mains.

38. The method of claim 23 wherein the situating step comprises situating conductive pathways comprising clusters of wires.

39. The method of claim 38 wherein the situating step comprises situating clusters of wires each of which comprises a plurality of wires disposed around a central wire.

40. The method of claim 39 additionally comprising the step of adjusting current in the plurality of wires so as to tune a field centroid of the cluster of wires.

41. The method of claim 23 wherein the situating step comprises situating current sheets.

42. The method of claim 23 additionally comprising the step of situating an electromagnetic shield surrounding the conductive pathways.

43. The method of claim 23 additionally comprising the step of joining pairs of conductive pathways of opposite charge at ends thereof by a member selected from the group consisting of loops of conductive material, current sheets, and conductive plates.

44. The method of claim 23 wherein the generating step comprises generating the electromagnetic field within a device selected from the group consisting of magnetic resonance imager, pulsed magnetic resonance imager, magnetic resonance microscope, nuclear magnetic resonance spectroscope, charged particle beam steerer, charged particle momentum analyzer, high-field pulsed-beam charged particle momentum analyzer, time-resolved charged-particle momentum analyzer, atomic clock, isotope separator, charged particle beam focuser, separator for removing ferromagnetic material from fluids, charged particle beam guider, charged particle energy analyzer, separator of fluids having different dielectric properties, and separator of particles from fluids.

45. An apparatus for generating an electromagnetic field internal to said apparatus and a substantially reduced electromagnetic field external to said apparatus, said apparatus comprising a first plurality of conductive pathways generating a cylindrical core volume of electromagnetic field and a second plurality of conductive pathways for substantially cancelling said electromagnetic field external to said second plurality.

46. The apparatus of claim 45 wherein said first and said second plurality of conductive pathways comprise a plurality of current sheets.

47. The apparatus of claim 45 wherein each of said second plurality of conductive pathways is located at an identical azimuthal position from a center of said core volume as a corresponding pathway of said first plurality of conductive pathways.

48. The apparatus of claim 47 wherein a current passing through each of said second plurality of conductive pathways is approximately equal to a current passing through each of said first plurality of conductive pathways multiplied by a ratio of a distance of said second plurality of conductive pathways from said center to a distance of said first plurality of conductive pathways from said center.

49. The apparatus of claim 48 wherein each of said second plurality of conductive pathways comprises n conductive lines and each of said first plurality of conductive pathways comprises m conductive lines, n/m being approximately equal to said ratio.

50. A method for generating an electromagnetic field internal to a device and a substantially reduced electromagnetic field external to the device, the method comprising the steps of:
 a) situating a first plurality of conductive pathways;
 b) generating a cylindrical core volume of electromagnetic field within a volume defined by the first plurality of conductive pathways; and
 c) situating a second plurality of conductive pathways for substantially canceling the electromagnetic field external to the second plurality.

51. The method of claim 50 wherein the situating steps comprise situating a plurality of current sheets.

52. The method of claim 50 wherein the step of situating a second plurality of conductive pathways comprises situating each of the second plurality of conductive pathways at an identical azimuthal position from a center of the core volume as a corresponding pathway of the first plurality of conductive pathways.

53. The method of claim 52 additionally comprising the step of passing a current through each of the second plurality of conductive pathways approximately equal to a current passing through each of the first plurality of conductive pathways multiplied by a ratio of a distance of the second plurality of conductive pathways from the center to a distance of the first plurality of conductive pathways from the center.

54. The method of claim 53 wherein the situating steps comprise forming each of the second plurality of conductive pathways of n conductive lines and each of the first plurality of conductive pathways of m conductive lines, n/m being approximately equal to the ratio.

55. A method for producing an apparatus for generating a region of a substantially uniform electromagnetic field characteristic, said apparatus comprising a central axis, the method comprising the steps of:
 a) determining initial sites for a plurality of conductive pathways about and substantially parallel to the central axis;
 b) simulating the siting of the plurality of conductive pathways;
 c) plotting $B_x=0$ contours resulting from the simulation;
 d) altering the sites of one or more of the plurality of conductive pathways; and
 e) repeating the simulating, plotting, and altering steps until desired $B_x=0$ contours are achieved.

56. The method of claim 55 wherein the repeating step comprises repeating until a predetermined plurality of $B_x=0$ contour crossings of an origin are achieved.

57. An apparatus for magnetic resonance imaging, said apparatus comprising a plurality of conductive pathways generating a core volume of magnetic field substantially homogenous in both magnitude and direction, said apparatus being substantially open to an ambient environment of a patient.

58. The apparatus of claim 57 wherein said apparatus comprises a side opening along the long axis of said apparatus through which the patient may pass into and out of said apparatus.

59. The apparatus of claim 57 additionally comprising means for substantially cancelling said magnetic field external to said apparatus, said means for substantially cancelling comprising a plurality of conductive lines external to said plurality of conductive pathways.

60. The apparatus of claim 59 wherein said conductive lines are located at the same azimuthal positions as said plurality of conductive pathways.

61. An apparatus for generating an electromagnetic field having a substantially uniform radial gradient, said apparatus comprising eighteen or more conductive pathways generating a cylindrical core volume of electromagnetic field substantially uniform in radial gradient.

62. The apparatus of claim 61 wherein said conductive pathways are each placed on a circle about a long axis of said cylindrical core volume and are substantially parallel to said long axis.

63. The apparatus of claim 62 wherein said conductive pathways define an approximately biconic volume having a long axis parallel to said long axis of said cylindrical core volume.

64. The apparatus of claim 62 wherein said conductive pathways are placed on said circle mirror symmetrically about both x and y axes of said circle.

65. The apparatus of claim 61 wherein said electromagnetic field comprises a magnetic field.

66. The apparatus of claim 65 wherein each of said conductive pathways comprises a substantially identical line current magnitude.

67. The apparatus of claim 61 wherein said electromagnetic field comprises an electric field.

68. The apparatus of claim 67 wherein each of said conductive pathways comprises a substantially identical line charge.

69. The apparatus of claim 61 additionally comprising means for substantially cancelling said electromagnetic field external to said apparatus, said means for substantially cancelling comprising a plurality of conductive lines equal in number to the number of said conductive pathways.

70. The apparatus of claim 69 wherein said conductive lines are located at the same azimuthal positions as said plurality of conductive pathways.

71. An apparatus for generating an electromagnetic field having a directional rotation in time, said apparatus comprising a plurality of conductive pathways generating a cylindrical core volume of electromagnetic field substantially uniform in magnitude or radial gradient and causing said electromagnetic field to rotate.

72. The apparatus of claim 71 additionally comprising means to cause said electromagnetic field to rotate substantially continuously.

73. The apparatus of claim 71 additionally comprising means to cause said electromagnetic field to rotate by steps.

74. The apparatus of claim 71 wherein said conductive pathways are each placed on a circle about a long axis of said cylindrical core volume and said conductive pathways are substantially parallel to said long axis.

75. The apparatus of claim 71 wherein said plurality of conductive pathways comprises a first and a second set of conductive pathways rotated 90 degrees with respect to each other and wherein a current in said first set varies as sin(a) and a current in said second set varies as cos(a), where a is a variable.

76. The apparatus of claim 71 wherein said plurality of conductive pathways comprises a first and a second set of conductive pathways rotated 90 degrees with respect to each other and wherein a peak current in said first set differs from a peak current in said second set, thereby generating an electromagnetic field whose magnitude varies as said electromagnetic field rotates.

77. The apparatus of claim 71 additionally comprising a solenoid placed around said conductive pathways to provide to said electromagnetic field a field vector having a constant component in the longitudinal direction.

78. The apparatus of claim 71 additionally comprising means for substantially cancelling said electromagnetic field external to said apparatus, said means for substantially cancelling comprising a plurality of conductive lines equal in number to said plurality of conductive pathways.

79. The apparatus of claim 78 wherein said conductive lines are located at the same azimuthal positions as said conductive pathways.

80. The apparatus of claim 71 wherein said apparatus comprises a quadrupole magnet rotating rapidly compared to a transit time of a stream of particles, whereby said stream of particles is focused.

81. An apparatus for generating a homogenous electromagnetic field, said apparatus comprising a plurality of conductive pathways generating a cylindrical core volume of both magnetic and electric field substantially homogenous in both magnitude and direction.

82. The apparatus of claim 81 wherein said conductive pathways are each placed on a circle about a long axis of said cylindrical core volume, said conductive pathways being substantially parallel to said long axis.

83. The apparatus of claim 81 wherein line charges of each of said conductive pathways are substantially identical.

84. An apparatus for generating an electromagnetic field having a substantially uniform nth derivative of field magnitude, said apparatus comprising a plurality of conductive pathways generating a core volume of said electromagnetic field, where n is an integer greater than 1.

85. The apparatus of claim 84 wherein said conductive pathways are each placed on a circle about a long axis of said cylindrical core volume, said conductive pathways being substantially parallel to said long axis.

86. An apparatus for separating substances in mixture or solution comprising means for generating an electric field having a substantially uniform nth derivative of field magnitude, said apparatus comprising a plurality of conductive pathways generating a core volume of said electric field, where n is an integer greater than 1.

87. The apparatus of claim 86 wherein said conductive pathways are each placed on a circle about a long axis of said cylindrical core volume, said conductive pathways being substantially parallel to said long axis.

\* \* \* \* \*